(12) United States Patent
Kim et al.

(10) Patent No.: US 8,765,538 B2
(45) Date of Patent: Jul. 1, 2014

(54) THREE DIMENSIONAL SEMICONDUCTOR MEMORY DEVICES AND METHODS OF FORMING THE SAME

(71) Applicant: Samsung Electronics Co., Ltd., Suwon-si (KR)

(72) Inventors: Bio Kim, Seoul (KR); Kihyun Hwang, Seongnam-si (KR); Jaeyoung Ahn, Seongnam-si (KR); SeungHyun Lim, Yongin-si (KR); Dongwoo Kim, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/061,304

(22) Filed: Oct. 23, 2013

(65) Prior Publication Data

US 2014/0099761 A1 Apr. 10, 2014

Related U.S. Application Data

(62) Division of application No. 13/323,452, filed on Dec. 12, 2011, now Pat. No. 8,575,682.

(30) Foreign Application Priority Data

Dec. 15, 2010 (KR) ........................ 10-2010-0128412

(51) Int. Cl.
*H01L 21/336* (2006.01)

(52) U.S. Cl.
USPC .... 438/197; 257/314; 257/319; 257/E21.423; 257/E29.3

(58) Field of Classification Search
USPC .............. 257/4, 314, 319, E21.423, E23.255, 257/E29.3
See application file for complete search history.

(56) References Cited

U.S. PATENT DOCUMENTS

| 2009/0310425 A1* | 12/2009 | Sim et al. ................. 365/185.29 |
| 2010/0118610 A1 | 5/2010 | Katsumata et al. |
| 2010/0120214 A1* | 5/2010 | Park et al. ..................... 438/287 |
| 2012/0153372 A1 | 6/2012 | Kim et al. |

FOREIGN PATENT DOCUMENTS

| JP | 2010-114369 | 5/2010 |
| JP | 2010-118530 | 5/2010 |
| KR | 10-2009-0128776 | 12/2009 |
| KR | 10-2010-0054100 | 5/2010 |

OTHER PUBLICATIONS

"Three Dimensional Semiconductor Memory Devices and Methods of Forming the Same" Specification, Drawings, and Prosecution History, of U.S. Appl. No. 13/323,452, filed Dec. 12, 2011, by Bio Kim, et al., which is stored in the United States Patent and Trademark Office (USPTO) Image File Wrapper (IFW) system.

* cited by examiner

*Primary Examiner* — Thao X Le
*Assistant Examiner* — Geoffrey Ida
(74) *Attorney, Agent, or Firm* — Onello & Mello, LLP

(57) ABSTRACT

Provided are three-dimensional semiconductor memory devices and methods of forming the same. The device includes a substrate, conductive patterns stacked on the substrate, and an active pattern penetrating the conductive patterns to be connected to the substrate. The active pattern may include a first doped region provided in an upper portion of the active pattern, and a diffusion-resistant doped region overlapped with at least a portion of the first doped region. The diffusion-resistant doped region may be a region doped with carbon.

4 Claims, 28 Drawing Sheets

THREE DIMENSIONAL SEMICONDUCTOR MEMORY DEVICES AND METHODS OF FORMING THE SAME

CROSS-REFERENCE TO RELATED APPLICATIONS

This application is a divisional application of U.S. non-provisional patent application Ser. No. 13/323,452, filed on Dec. 12, 2011, which claims the benefit of Korean Patent Application No. 10-2010-0128412, filed on Dec. 15, 2010, in the Korean Intellectual Property Office, the entire contents of which applications are hereby incorporated by reference.

FIELD OF INVENTION

The inventive concepts disclosed herein relate to semiconductor devices, and more particularly, to three-dimensional semiconductor memory devices including three-dimensionally (3D) arranged memory cells.

BACKGROUND

A 3D-IC (integrated circuit) memory technique may be used to increase a memory capacity. The 3D-IC memory technique generally refers to technology related to arranging memory cells three-dimensionally.

One 3D-IC technique is a "punch-and-plug" technique. The punch-and-plug technique includes sequentially forming multi-layered thin layers on a substrate and then forming plugs to penetrate the thin layers. Through this technique, without a drastic increase in manufacturing costs, a three-dimensional memory device may be made having an increased memory capacity.

SUMMARY

In accordance with various aspects of the inventive concept, there may be provided three-dimensional memory devices having improved electrical properties.

In accordance with other aspects of the inventive concept, there may be provided methods of fabricating a three-dimensional memory device with improved electrical properties.

According to one aspect of the inventive concept, a three-dimensional semiconductor device may include a substrate, conductive patterns stacked on the substrate, and at least one active pattern penetrating the conductive patterns and coupled to the substrate. The active pattern may include a first doped region provided in an upper portion of the active pattern, and a diffusion-resistant doped region overlapped with at least a portion of the first doped region. The diffusion-resistant doped region may be doped with carbon.

In some embodiments, the first doped region may be n-type.

In some embodiments, the diffusion-resistant doped region can have a bottom surface located at a higher level than a top surface of the uppermost one of the conductive patterns.

In some embodiments, the device may further include a gap-filling pattern provided in the active pattern. A point with the highest carbon concentration of the diffusion-resistant doped region may be located at a higher level than a top surface of the gap-filling pattern.

In some embodiments, the first doped region may be doped with n-type impurities and a point with the highest carbon concentration may be located at a lower level than a point with the highest n-type impurity concentration of the first doped region.

In some embodiments, a carbon concentration of the diffusion-resistant doped region may be lower near a center of the active pattern than near a sidewall of the active pattern.

In some embodiments, the active pattern may be formed of a silicon containing material, and in the diffusion-resistant doped region, the number of carbon atoms per unit volume may be about 0.1% to about 2% with respect to the number of silicon atoms per unit volume.

In some embodiments, a point with the highest carbon concentration of the diffusion-resistant doped region may be located at a deeper level than a point with the highest n-type impurity concentration of the first doped region.

In some embodiments, the device may further include a memory layer interposed between the conductive patterns and the active pattern.

In some embodiments, the device may further include an inversion inducing pattern disposed on the conductive patterns. The inversion inducing pattern may be overlapped with the first doped region, in teams of vertical position.

According to other aspects of the inventive concept, a method of fabricating a three-dimensional semiconductor device may include forming a stacking structure including conductive patterns and insulating patterns alternatingly stacked on a substrate, and forming an active pattern connected to the substrate through the stacking structure. The forming of the active pattern may include doping an upper portion of the active pattern with carbon, and forming a first doped region in the upper portion of the active pattern, the first doped region having a different conductivity type from the substrate.

In some embodiments, the forming of the stacking structure may include alternatingly forming the insulating patterns and sacrificial patterns on the substrate, and replacing the sacrificial patterns with the conductive patterns.

In some embodiments, the forming of the active pattern may include forming a first channel hole penetrating the sacrificial patterns and the insulating patterns, and forming a first semiconductor pattern and a gap-filling pattern in the first channel hole. The carbon doping of the active pattern may be performed to inject carbon atoms into the first semiconductor pattern.

In some embodiments, the forming of the active pattern may include forming a first channel hole penetrating the sacrificial patterns and the insulating patterns, and forming a first semiconductor pattern and a gap-filling pattern in the first channel hole, removing an upper portion of the gap-filling pattern to form a second channel hole, and filling the second channel holes with a second semiconductor pattern. The first doped region may be formed in the second semiconductor pattern and an upper portion of the first semiconductor pattern.

In some embodiments, the forming of the first doped region includes injecting n-type impurities into the upper portion of the active pattern, and an injection depth of carbon may be deeper than that of the n-type impurities.

According to other aspects of the inventive concept, a three-dimensional semiconductor device is provided. The device comprises a substrate, a plurality of conductive patterns and a plurality of insulating layers stacked on the substrate in an alternating manner, and at least one active pattern penetrating the conductive patterns and insulating layers and coupled to the substrate. Each active pattern comprises a first doped region provided in an upper portion of the active pattern and a diffusion-resistant doped region in the first doped region.

In some embodiments, the diffusion-resistant doped region may be a region doped with carbon.

In some embodiments, the first doped region may includes a first impurity injection region at a top of the active pattern and an impurity extension region extending from the first impurity injection region in the direction of the substrate. The diffusion-resistant doped region may be completely formed within the first impurity injection region.

In some embodiments, the first doped region may includes a first impurity injection region at a top of the active pattern and an impurity extension region extending from the first impurity injection region in the direction of the substrate. The diffusion-resistant doped region may be formed within both of the first impurity injection region and impurity extension region.

In some embodiments, the first doped region may includes a first impurity injection region at a top of the active pattern and an impurity extension region extending from the first impurity injection region in the direction of the substrate. And the device may further comprise an inversion inducing pattern disposed between a first string selection line and the impurity injection region.

BRIEF DESCRIPTION OF THE DRAWINGS

Aspects of the inventive concept will be more clearly understood from the following brief description taken in conjunction with the accompanying drawings.

FIG. 1 is a circuit diagram of an example embodiment of a three-dimensional semiconductor memory device, according to aspects of the inventive concept;

FIGS. 2 and 3 are perspective and enlarged sectional views illustrating example embodiments of a three-dimensional semiconductor device, according to aspects of the inventive concept;

FIGS. 4 and 5 are enlarged sectional views of another example embodiment of a three-dimensional semiconductor device, according to aspects of the inventive concept;

FIG. 6 is a schematic diagram a comparative example embodiment of a three-dimensional semiconductor device, according to aspects of the inventive concept;

FIGS. 7 through 9 are graphs illustrating example embodiments of doping profiles of a first doped region and a diffusion-resistant doped region, according to aspects of the inventive concept;

FIGS. 10 through 17 are sectional views illustrating example embodiments of methods of fabricating a three-dimensional semiconductor device, according to aspects of the inventive concept;

FIGS. 18 through 20 are sectional views illustrating example embodiments of methods of forming a diffusion-resistant doped region, according to aspects of the inventive concept;

FIGS. 21 and 22 are sectional views illustrating example embodiments of methods of forming a diffusion-resistant doped region according to other aspects of the inventive concept;

FIGS. 23 through 25 are perspective and sectional views illustrating example embodiments of a method of fabricating a three-dimensional semiconductor device according to other aspects of the inventive concept;

FIG. 26 is a sectional view illustrating an example embodiment of method of fabricating a three-dimensional semiconductor device, according to still other aspect of the inventive concept;

FIGS. 27 through 29 are perspective views illustrating example embodiments of memory layers, according to aspects of the inventive concept;

FIG. 30 is a schematic block diagram illustrating an example embodiment of a memory system including a three-dimensional semiconductor memory device, according to aspects of the inventive concept;

FIG. 31 is a block diagram illustrating an example embodiment of a memory card including a three-dimensional semiconductor memory device, according to aspects of the inventive concept; and FIG. 32 is a block diagram illustrating an example embodiment of a data processing system including a three-dimensional semiconductor memory device, according to aspects of the inventive concept.

Figure 1:
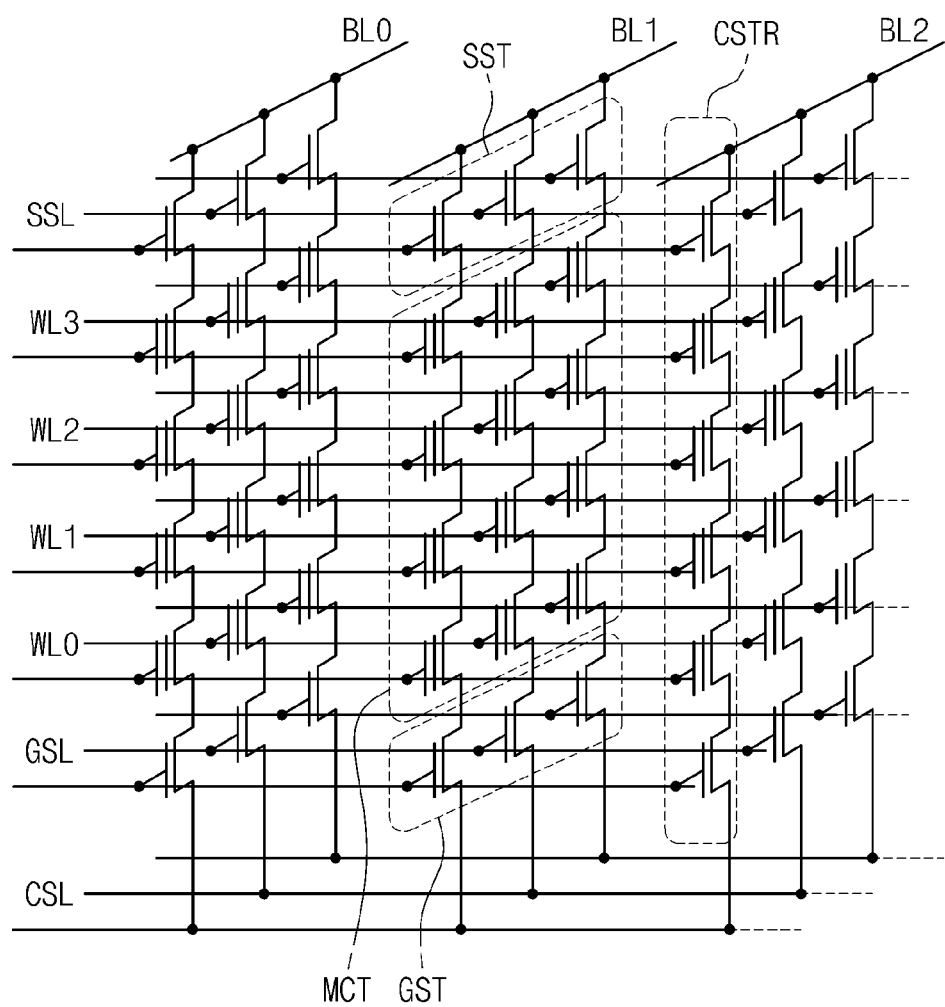
FIGS. 1 through 32 represent non-limiting, example embodiments as described herein.

It should be noted that these figures are intended to illustrate the general characteristics of methods, structures, and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by the disclosed example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Aspects of the inventive concept will now be described more fully with reference to the accompanying drawings, in which example embodiments are shown. The inventive concept may, however, be embodied in many different forms and should not be construed as being limited to the embodiments set forth herein. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Aspects of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

A three-dimensional (3D) semiconductor memory device according to aspects of the inventive concept may include a cell array region, a peripheral circuit region, a sense amp (amplifier) region, a decoding circuit region, and a connection region. A plurality of memory cells and bit lines and word lines for electrical connection to the plurality of memory cells may be in the cell array region. Circuits for driving the memory cells may be in the peripheral circuit region, and circuits for reading information stored in the memory cells may be in the sense amp region. The connection region may be between the cells array region and the decoding circuit region, and a wiring structure for electrically connecting the word lines with the decoding circuit region may be between the word lines and the decoding region.

FIG. 1 is a circuit diagram of an example embodiment of a 3D semiconductor memory device 100, according to aspects of the inventive concept.

Referring to FIG. 1, in some embodiments of the inventive concept, the cell array of the 3D semiconductor memory device may include common source lines CSL, bit lines BL0, BL1, and BL2 and cell strings CSTR interposed between the common source lines CSL and the bit lines BL0-BL2.

The bit lines BL0-BL2 may be two-dimensionally arranged and plural cell strings CSTR may be connected in parallel to each of the bit lines BL. Plural cell strings CSTR may be connected in common to a corresponding one of the common source lines CSL. That is, a plurality of the cell strings CSTR may be disposed between the bit lines BL0-BL2 and each of the common source lines CSL. In some embodiments, the common source lines CSL may be connected with one another in an equipotential state. Otherwise, in other embodiments, the common source lines CSL may be electrically separated from one another, such that they are controlled independently.

Each of the cell strings CSTR may include a ground selection transistor GST coupled to a corresponding one of the common source line CSL, a string selection transistor SST coupled to a corresponding one of the bit lines BL0-BL2, and a plurality of memory cell transistors MCT disposed between the ground selection transistor GST and the string selection transistor SST. Here, the plurality of the memory cell transistors MCT may be connected in series between the ground selection transistor GST and the string selection transistor SST.

Sources regions of plural ground selection transistors GST may be connected in common to a corresponding one of the common source lines CSL. In addition, ground selection lines GSL, word lines WL0 to WL3 and string selection lines SSL, which serve as gate electrodes of the ground selection transistor GST, the memory cell transistors MCT and the string selection transistor SST, respectively, may be disposed between the common source lines CSL and the bit lines BL0-BL2. Moreover, each of the memory cell transistors MCT may include a data storage element.

In some aspects of the inventive concept, one of the cell strings CSTR may include a plurality of the memory cell transistors MCT disposed (or spaced) at different distances from the corresponding common source line CSL. That is, between the common source lines CSL and the bit lines BL0-BL2, there may be a multi-layered word line structure including the word lines WL0-WL3 disposed at different levels from each other.

In addition, gate electrodes of the memory cell transistors MCT, which are disposed at the substantially same level from the common source lines CSL, may be connected in common to one of the word lines WL0-WL3 such that they are in an equipotential state. Alternatively, in other embodiments, although gate electrodes of the memory cell transistors MCT may be disposed at the substantially same level, i.e., distance from the common source lines CSL, a portion thereof (e.g., gate electrodes disposed in one row or column) may be electrically and spatially separated from other portions thereof (e.g., gate electrodes disposed in other row or column).

Figure 2:
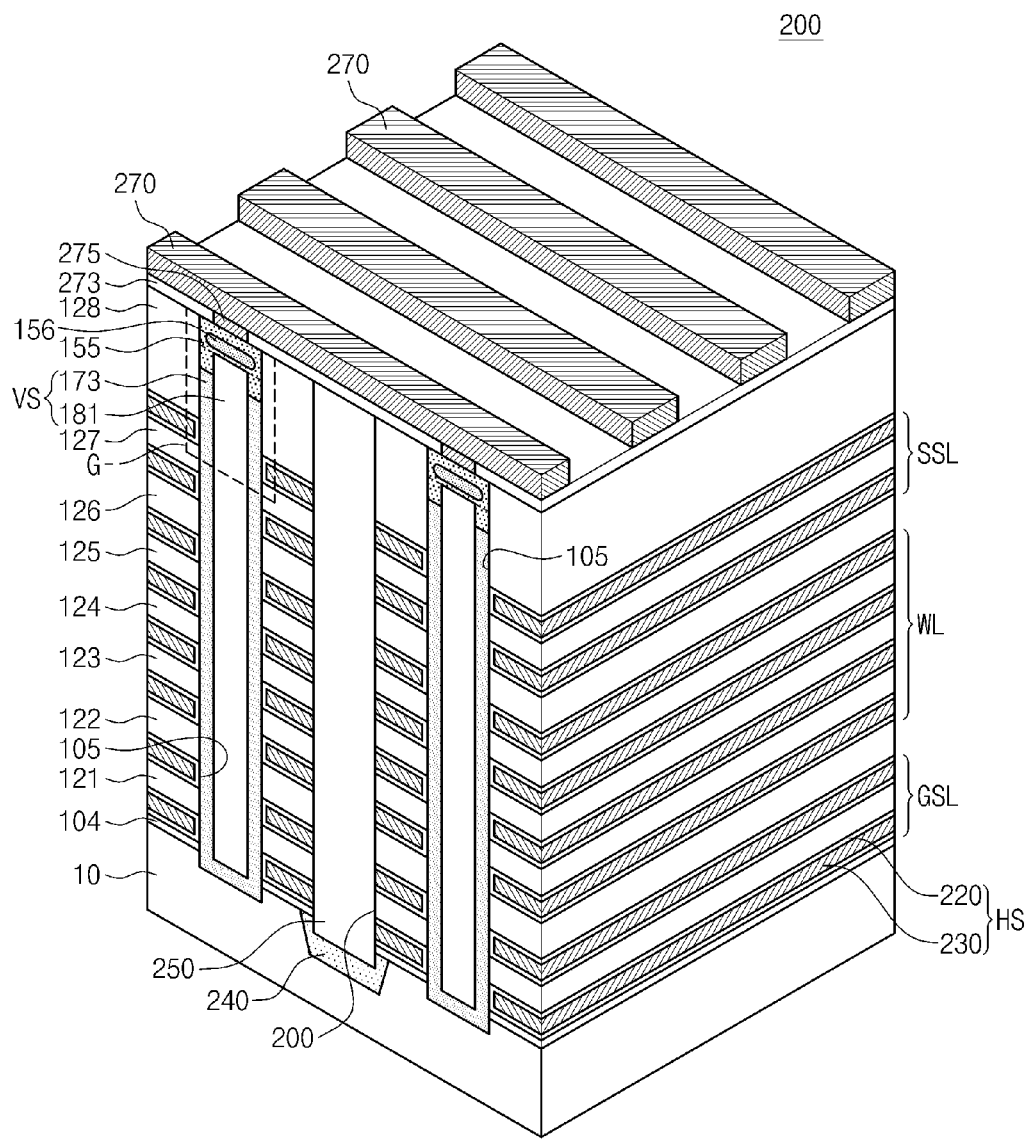
Figure 3:
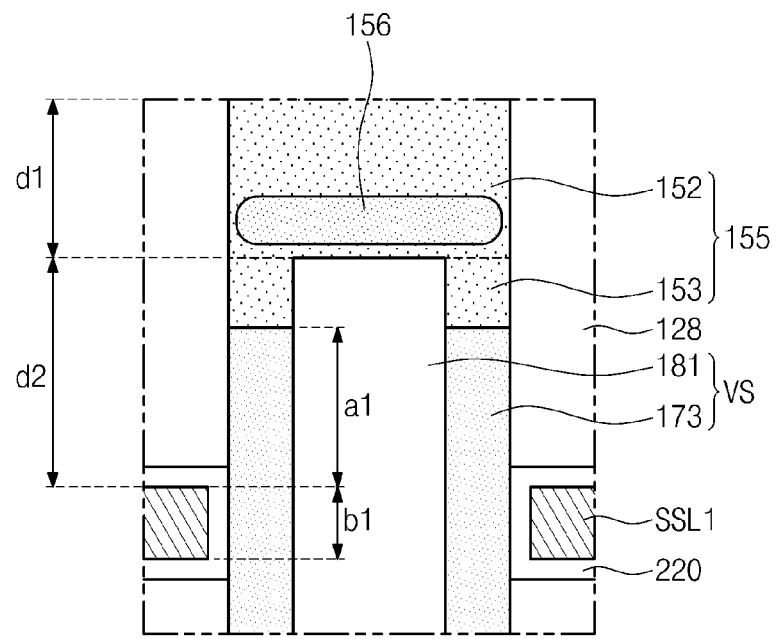

FIG. 2 is a perspective view of an embodiment of a three-dimensional semiconductor device 200 according to aspects of the inventive concept, and FIG. 3 is an enlarged sectional view of a portion G of FIG. 2.

Referring to the embodiments FIGS. 2 and 3, conductive patterns 230 and first to eighth insulating layers 121-128 may be stacked on a substrate 10 in an alternating manner. The substrate 10 may be formed of a semiconductor material, an insulating material, or a semiconductor or conductive material covered with an insulating layer. For example, the substrate 10 may be a silicon wafer. The substrate 10 may be provided as a structure doped with impurities of a first conductivity type. For instance, the substrate 10 may be a p-type silicon wafer.

The conductive patterns 230 may include at least one layer of doped silicon, metal, metal nitride, or metal silicide, as examples. For example, the conductive patterns 230 may include a layer of tantalum nitride or tungsten. The insulating layers 121-128 may include at least one layer of silicon oxide or silicon nitride. In some embodiments, as shown in FIG. 2, the two lowermost conductive patterns 230 may serve as ground selection lines GSL, and the two uppermost conductive patterns 230 may serve as the string selection lines SSL1 and SSL2 (hereinafter, SSL). The others of the conductive patterns 230 may serve as word lines WL.

In some embodiments, at least one of the insulating layers 121-128 may be formed to have a different thickness than the others. For instance, the insulating layer second from the bottom (hereinafter, second insulating layer 122) and the insulating layer third from the top (hereinafter, sixth insulating layer 126) may be thicker than other insulating layers 121, 123-125 and 127. Moreover, the uppermost insulating layer 128 may be thicker than the second and sixth insulating layers 122 and 126.

First structures VS may be provided to penetrate a plurality or all of the conductive patterns 230. In this embodiment, the first structures VS are arranged substantially orthogonal to the conductive patterns 230 and substrate 10. For instance, the first structures VS may be provided in channel holes 105 penetrating the conductive patterns 230. Here, each of the channel holes 105 may have a circular, elliptical, quadrilateral or linear section in plan view.

The first structures VS may include active patterns 173 provided on an inner surface of the channel holes 105 and a first gap-filling pattern 181 filling the gap within the or between active patterns 173 within a channel hole. As a result, the channel holes 105 are filled. In some embodiments, the first gap-filling pattern 181 may be formed of at least one of silicon nitride or silicon oxide, and the active patterns 173 may be formed of polysilicon. In other embodiments, the active patterns 173 may be formed of at least one of organic semiconductors or carbon nano materials.

In some embodiments, the active patterns 173 may be formed to have a substantially conformal thickness, such that the channel holes 105 are not completely filled by the active patterns 173, such as is shown in FIG. 3. The active patterns 173 may include a d1 region disposed on the first gap-filling pattern 181 and a d2 region disposed between top surfaces of the first gap-filling pattern 181 and the first string selection line SSL1.

Each of the active patterns 173 may include channel regions adjacent to the conductive patterns 230 and channel connecting regions between the channel regions and between the channel region and a doped region, which will be described below. For instance, the channel regions may include a first channel region b1 adjacent to the first string selection line SSL1, and the channel connecting regions may include a first channel connecting region a1 provided on the first channel region b1, as shown in FIG. 3.

In the case that a voltage is applied to the conductive patterns 230 during an operation of the 3D semiconductor memory device, an energy band structure of the active patterns 173 adjacent to the conductive patterns 230 (i.e., the channel region) may be changed by an electric field from the conductive patterns 230. For instance, if the voltage applied to the conductive patterns 230 is high, an inversion region may be formed in the channel region. Additionally, the energy band structure of the channel connecting regions may be changed by an electric fringe field from the conductive patterns 230. As a result, for instance, the inversion region may extend to other portions of the active patterns 173 adjacent to the insulating layers 121~128 (i.e., the channel connecting regions). The extending portion of the inversion region may serve as a common electrode or source/drain electrode, which is shared in common by two transistors vertically spaced apart from each other. In some embodiments, the sharing of the extending portion of the inversion region may be used to electrically connect transistors, which use the ground selection lines GSL, the word lines WL, and the string selection lines SSL as their gate electrodes.

A memory layer 220 may be provided between the conductive patterns 230 and the first structures VS. The memory layer 220 and the conductive patterns 230 may constitute second structures HS, as shown in FIG. 2. The structure of the memory layers 220 will be described in more detail with reference to FIGS. 27 through 29.

First doped regions 155 may be provided in an upper portion of the active patterns 173. In some embodiments, the first doped regions 155 may be configured to electrically connect the cell strings to the bit lines BL. The first doped regions 155 may be doped with impurities having a conductivity type different from the substrate 10. For instance, the first doped region 155 may be n-type. In some embodiments, the first doped region 155 may include an impurity injection region 152 provided on the first gap-filling pattern 181 and an impurity extension region 153 extending downward from the impurity injection region 152 toward the substrate 10. In this embodiment, the impurity extension region 153 extends from the impurity injection regions to the top of the active pattern 173, and is disposed adjacent to sidewalls of an upper portion of the first gap-filling pattern 181. As will be described below, the impurity extension region 153 may be formed as a result of downward diffusion of impurities injected in the impurity injection region 152, which may occur during a subsequent thermal treatment process.

A diffusion-resistant doped region 156 may be provided in the upper portion of the active patterns 173. The diffusion-resistant doped region 156 may be overlapped with at least a portion of the first doped region 155. The diffusion-resistant doped region 156 may be enclosed, encased, or embedded within the first doped region 155. The diffusion-resistant doped region 156 may be formed to have a bottom surface located at a higher level than the uppermost surface of the uppermost conductive pattern 230 (i.e., a top surface of the first string selection line SSL1). The diffusion-resistant doped region 156 may be doped with diffusion-resistant elements capable of suppressing diffusion of impurities injected in a silicon lattice. In some embodiments, the diffusion-resistant element may be carbon (C). In more detail, in the case that phosphorus (P) is used as the impurity, phosphorus atoms may be diffused through interstitial sites in the active patterns 173. However, carbon atoms injected into the active patterns 173 may prevent the phosphorus atoms from being diffused via the interstitial sites. In some embodiments, at a position having the maximum carbon concentration in the diffusion-resistant doped region 156, the number of carbon atoms per unit volume may be about 0.1% to about 2% with respect to the number of silicon atoms per unit volume.

A shape and/or a carbon doping profile of the diffusion-resistant doped region 156 may be modified in various manners, without departing from the inventive concepts. For instance, as shown in FIG. 3, the diffusion-resistant doped region 156 may be provided on or above the first gap-filling pattern 181. In some embodiments, the diffusion-resistant doped region 156 may have the highest carbon concentration and be at a higher level than a top surface of the first gap-filling pattern 181, with a portion of the impurity injection region 152 disposed there between. In other embodiments, the diffusion-resistant doped region 156 may be provided or extend below the impurity injection region 152. In still other embodiments, the impurity extension region 153 may be provided below the diffusion-resistant doped region 156.

In some embodiments, a second gap-filling pattern 250 may be provided to penetrate the conductive patterns 230. The second gap-filling pattern 250 may be provided in a trench 200 penetrating the conductive patterns 230 and exposing the substrate 10. A second doped region 240 may be provided below the second gap-filling pattern 250. The second doped region 240 may have a different conductivity type from the substrate 10. For instance, the second doped region 240 may be n-type.

Upper plugs 275 may be provided on the first structures VS, respectively, and upper interconnection lines 270 may be provided on the upper plugs 275 to connect the upper plugs 275 with each other. The upper plugs 275 may be provided in an interlayer dielectric 273. The upper plugs 275 and the upper interconnection lines 270 may be formed of at least one of doped silicon and metallic materials, or combinations thereof. Each of the upper interconnection lines 270 may be electrically connected to a corresponding one of the first structures VS, via a corresponding one of the upper plugs 275. The upper interconnection lines 270 may be formed to cross the second structures HS or the trench 200. According to example embodiments of the inventive concept with respect to a NAND FLASH memory, the upper interconnection lines 270 may serve as the bit lines connected to upper ends of cell strings.

Figure 4:
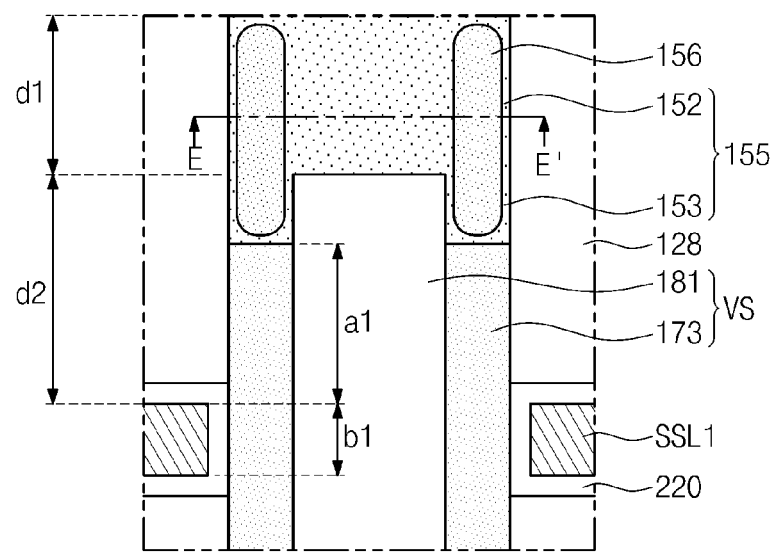
Figure 5:
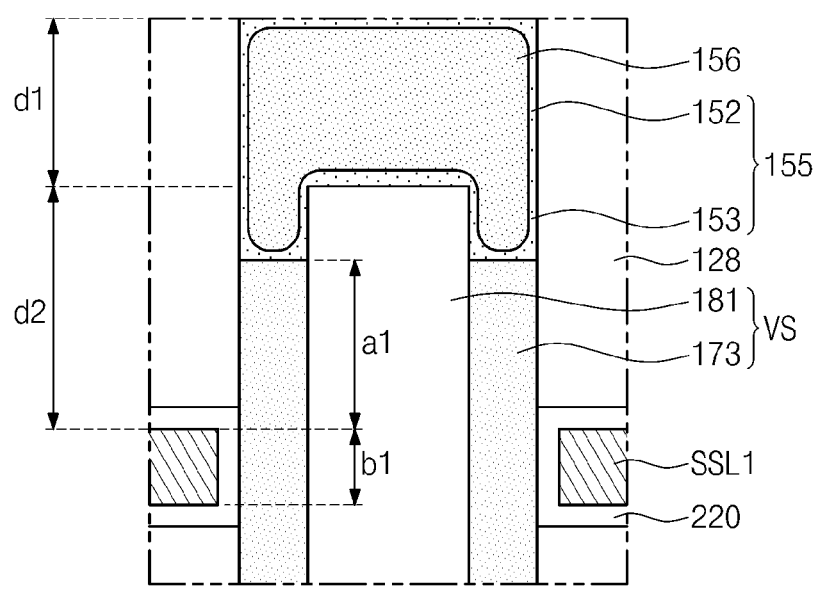

FIGS. 4 and 5 are enlarged sectional views illustrating example embodiments of the diffusion-resistant doped region 156 according to other aspects of the inventive concept. From a sectional view, the diffusion-resistant doped region 156 may be provided between a sidewall of the first gap-filling pattern 181 and an outer sidewall of the active patterns 173, as shown in the example embodiment of FIG. 4. The diffusion-resistant doped region 156 may extend downward and have a bottom surface positioned near a bottom surface of the impurity extension region 153. The diffusion-resistant doped region 156 may occupy the substantially same volume as the first doped region 155, as shown in the example embodiment of FIG. 5.

Figure 6:
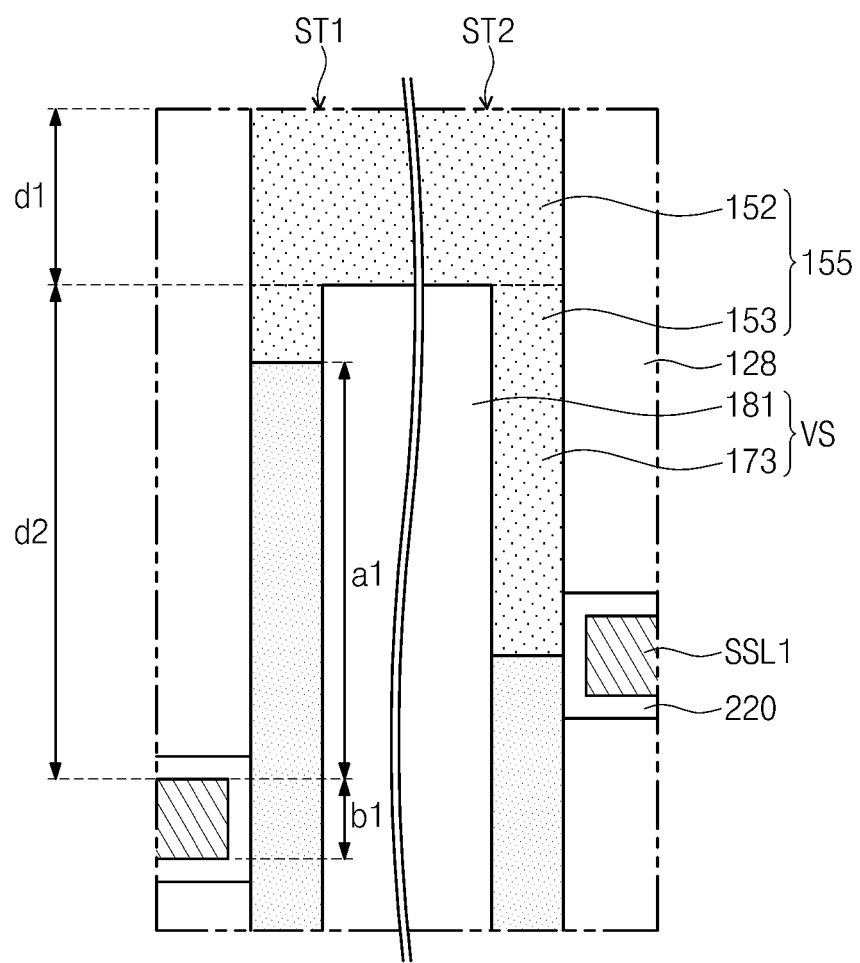

FIG. 6 is a schematic diagram providing a comparative example embodiment of a three-dimensional semiconductor device, according to aspects of the inventive concept. In the case that, in terms of vertical position, the impurity extension region 153 is vertically overlapped with the first string selection line SSL1, as depicted in a right side of a second cell string ST2 of FIG. 6, a string selection transistor may exhibit an deteriorated operational characteristic. In order to avoid such an overlap, as depicted in a left side of a first cell string ST1 of FIG. 6, a vertical length of the d2 region may be increased, compared with the case of the right side of the second cell string ST2. However, the elongation or length of the d2 region leads to a vertical elongation of the first channel connecting region a1, and thus, it becomes difficult for a fringe field from the first string selection line SSL1 to induce an inversion region in the first channel region a1. As a result, the string selection transistor may exhibit an increased resistance property.

According to aspects of the inventive concept, the diffusion-resistant doped region 156 may suppress impurities in the impurity injection region 152 from being excessively diffused. As a result, the impurity extension regions 153 may be formed to the substantially same depth, regardless of their positions in a wafer. This enables avoidance of an increase in resistance of cell strings or deterioration in operational characteristics of transistors.

Figure 7:
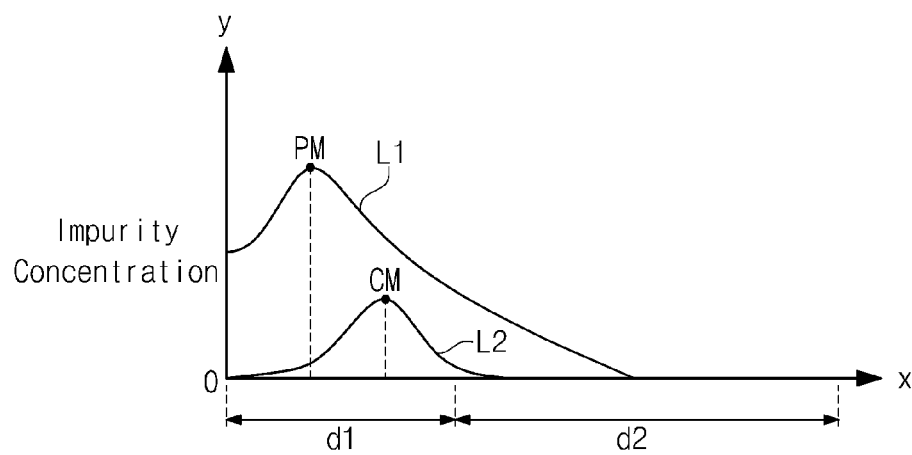
Figure 8:
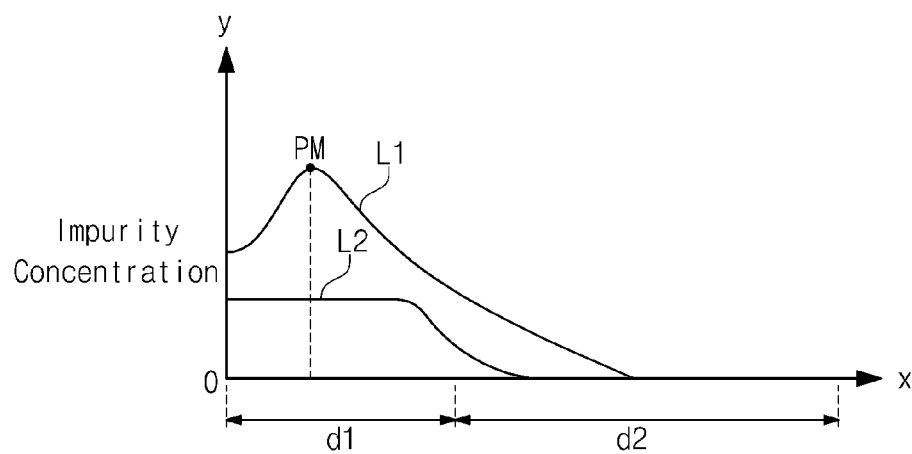
Figure 9:
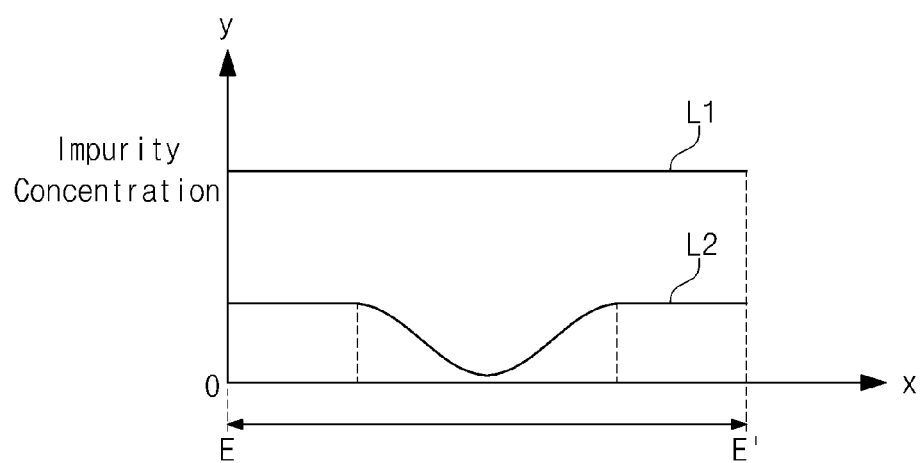

FIGS. 7 through 9 are graphs illustrating exemplarily embodiments of doping profiles of the first doped region 155 and the diffusion-resistant doped region 156, according to aspects of the inventive concept. In the following description, it will be assumed that the first doped region 155 is doped with phosphorus (P), but example embodiments of the inventive concept may not be limited thereto. In the graphs, a phosphorus concentration of the first doped region 155 is depicted by a curve L1, and a carbon concentration of the diffusion-resistant doped region 156 is depicted by a curve L2. Referring to FIG. 7, a P-point PM having the highest phosphorus concentration in the first doped region 155 and a C-point CM having the highest carbon concentration in the diffusion-resistant doped region 156 may be located within the d1 region. And the C-point CM may be closer to the d2 region than the P-point PM.

The carbon concentration depicted by the curve L2 may be substantially constant in a specific region, as exemplarily shown in FIG. 8. This constancy in the carbon concentration may result from an in-situ process to be described below.

FIG. 9 shows an exemplary embodiment of a graph of concentrations of phosphorus and carbon taken along a line E-E' of the embodiment in FIG. 4. Referring to FIG. 9, the carbon concentration may be constant near the outer sidewall of the active patterns 173 and gradually decrease reaching the minimum near a central axis of the active patterns 173. FIGS. 7 through 9 are presented as examples of impurity doping profiles according to example embodiments of the inventive concept, but the inventive concept is not limited thereto. For instance, in other embodiments, the doping profile can be modified in order to prevent n-type impurities from being diffused (especially, downward to the first channel connecting region a1).

Example embodiments of methods of fabricating a three-dimensional semiconductor device according to aspects of the inventive concept will be described with reference to FIGS. 10 through 17. For convenience in description, the aforesaid technical features may not be repeated below.

Figure 10:
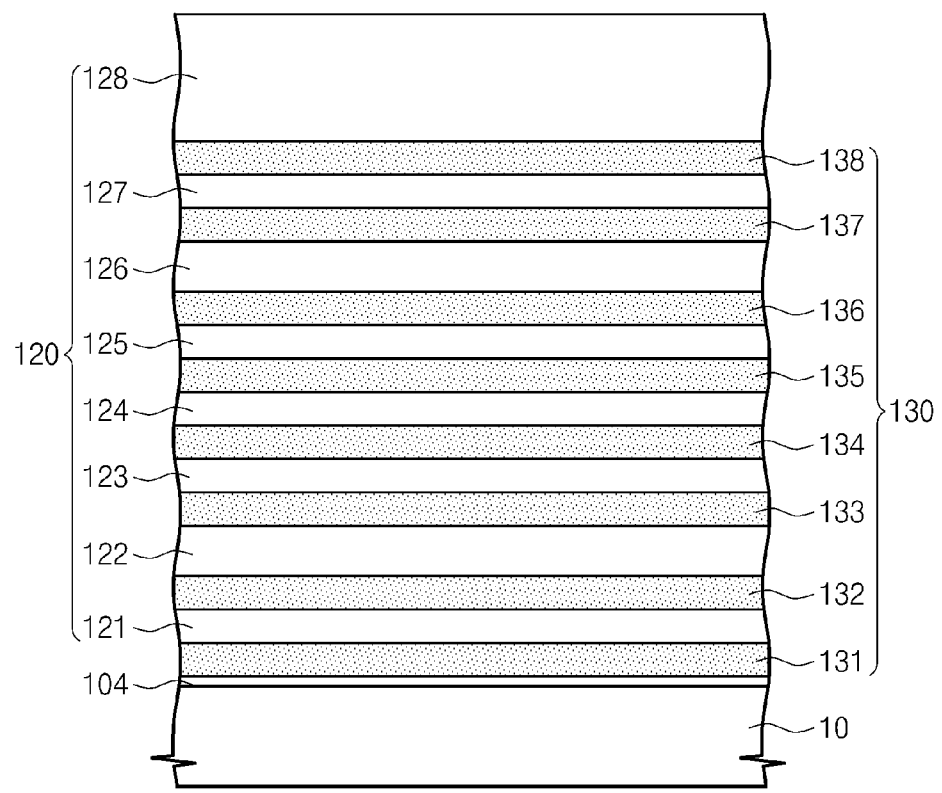

Referring to the example embodiment of FIG. 10, a mold structure 1000 comprising a plurality of layers may be formed on a substrate 10. The substrate 10 may be formed of a semiconductor material, an insulating material, or a semiconductor or conductive material covered with an insulating layer. For example, the substrate 10 may be a silicon wafer. The substrate 10 may be provided as a structure doped with impurities of a first conductivity type. For instance, the substrate 10 may be a p-type silicon wafer. The mold structure 1000 may include a plurality of sacrificial layers 130 and a plurality of insulating layers 120 alternatingly stacked on the substrate 10. In order to reduce complexity in the drawings and to provide better understanding of aspects of the inventive concept, it will be assumed that the sacrificial layers 130 include first to eighth sacrificial layers 131-138 and the insulating layers 120 include first to eighth insulating layers 121-128, although a different number of each type of layer could be provided in other embodiments.

The sacrificial layers 130 and the insulating layers 120 may be formed of materials having an etch selectivity with respect to each other. For instance, the insulating layers 120 may be formed of a material that is etched at a slower rate than a material of the sacrificial layer 130 with respect to an etchant for removing the sacrificial layers 130. The etch selectivity may be quantitatively expressed as a ratio of an etch rate of the sacrificial layer 130 to the insulating layer 120. In some embodiments, the sacrificial layer 130 may be one or more materials providing an etch selectivity of 1:10 to 1:200 (e.g., 1:30 to 1:100) with respect to one or more materials of the insulating layers 120. For example, the insulating layers 120 may be at least one of a silicon oxide and a silicon nitride, and the sacrificial layers 130 may be at least one of silicon, silicon oxide, silicon carbide and silicon nitride. The sacrificial layers 130 may be selected to be a different material from the insulating layers 120.

In the following description, for easier understanding of aspects of the inventive concept, example embodiments will be described with respect to the insulating layers 120 of silicon oxide and the sacrificial layers 130 of silicon nitride. However, example embodiments and the inventive concept are not limited to silicon oxide and silicon nitride, and each layer is not limited to a single material. In addition, a buffer layer 104 may be further provided between the first sacrificial layer 131 and the substrate 10, and in some embodiments, the buffer layer 104 may be formed of silicon oxide.

At least one of the insulating layers 120 may be formed to have a different thickness than others of the insulating layers. For instance, the second insulating layer 122 and the sixth insulating layer 126 may be thicker than other insulating layers 121, 123, 125 and 127. Moreover, the uppermost insulating layer 128 may be thicker than the second and sixth insulating layers 122 and 126, in consideration of a thickness reduction, which may result from a subsequent planarizing or etching process, or an expansion of a first doped region to be described below. The thicknesses of the insulating layers 120 and the sacrificial layers 130 may be modified from the drawings and the number of layers constituting the mold structure 1000 may be diversely modified.

Figure 11:
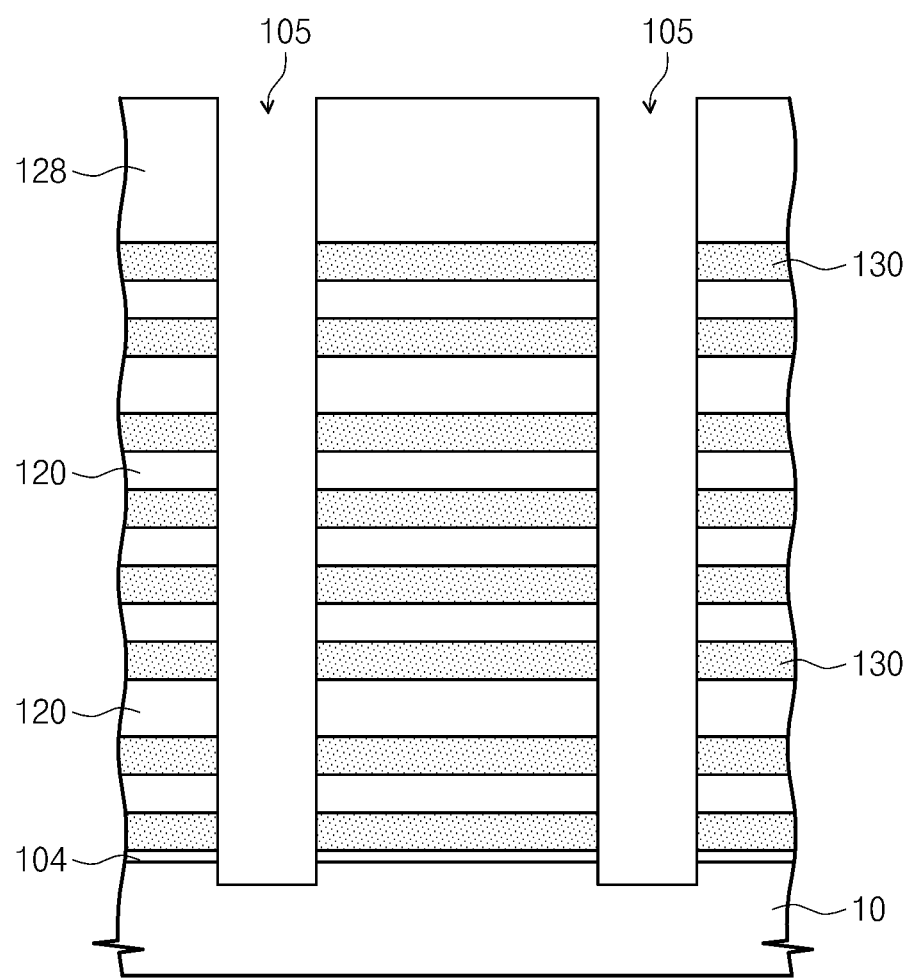

Referring to the example embodiment of FIG. 11, channel holes 105 may be formed to penetrate the sacrificial layers 130 and the insulating layers 120. Here, each of the channel holes 105 may have a circular, elliptical, quadrilateral, or linear section in a plan view. And each of the channel holes 105 may be formed with a shape in which its depth may be at least five times its width (e.g., an aspect ratio of 5). In some embodiments, the channel holes 105 may be two-dimensionally formed on or into the top surface (i.e., in an xy plane) of the substrate 10. For example, each channel hole 105 may be an isolated region spaced apart from other channel holes 105 with respect to x and y directions in the xy plane.

The formation of the channel holes 105 may include forming a mask pattern defining positions of the channel holes 105 on the mold structure 1000 and, for example, anisotropically etching the mold structure using the mask pattern as an etch mask. Because the mold structure 100 may include at least two kinds of different layers, the sidewall of the channel holes 105 may not be completely perpendicular to the top surface of the substrate 10. For example, the channel holes 105 may be formed to have a downward tapered shape.

As shown in the example embodiment of FIG. 11, the channel holes 105 may be formed to expose the top surface of the substrate 10. In some embodiments, the substrate 10 below the channel holes 105 may be recessed due to over-etch during the anisotropic etching of the mold structure 1000.

Figure 12:
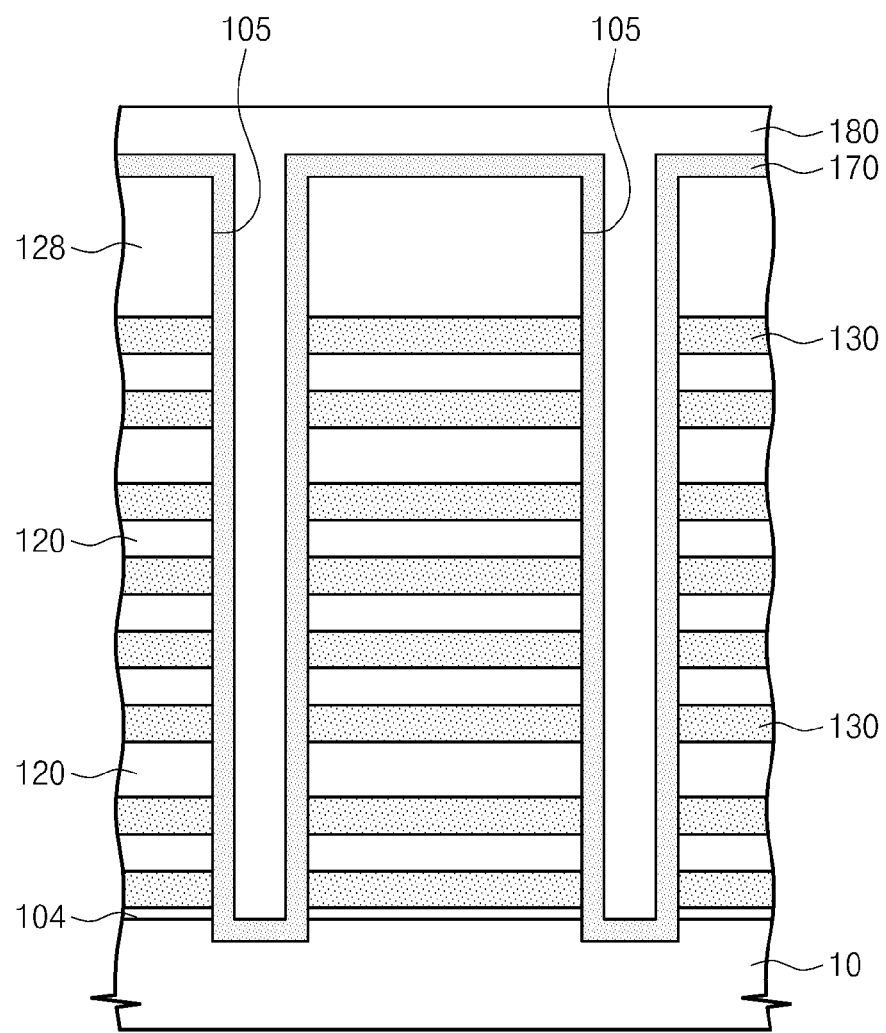

Referring to the example embodiment of FIG. 12, a semiconductor layer 170 may be formed to cover the inner walls of the channel holes 105, i.e., sidewalls and the bottom of a channel hole 105. The semiconductor layer 170 may be a silicon layer (e.g., a polycrystalline silicon layer) formed using one of, for example, atomic layer deposition (ALD) and chemical vapor deposition (CVD). The semiconductor layer 170 may be formed, for example, with a thickness ranging from about $\frac{1}{50}$ to $\frac{1}{5}$ of the width of the channel holes 105. In some embodiments, the semiconductor layer 170 may be, for example, one of an organic semiconductor layer and carbon nano structures, and it may be formed not to completely fill the channel holes 105. Thereafter, a first gap-filling layer 180 may be formed on the semiconductor layer 170 to fill the channel holes 105. The first gap-filling layer 180 may be one of a spin-on-glass (SOG) insulating layer or a silicon oxide layer. In some embodiments, a hydrogen annealing step may be performed (e.g., before the formation of the first gap-filling layer 180) to thermally treat the resultant structure provided with the semiconductor layer 170 under a gas atmosphere including hydrogen and/or heavy hydrogen. Crystal defects in the semiconductor layer 170 may be cured and/or reduced during the hydrogen annealing.

In other embodiments, the semiconductor layer 170 may be formed to fill the channel holes 105, and the formation of the first gap-filling layer 180 may be omitted.

Figure 13:
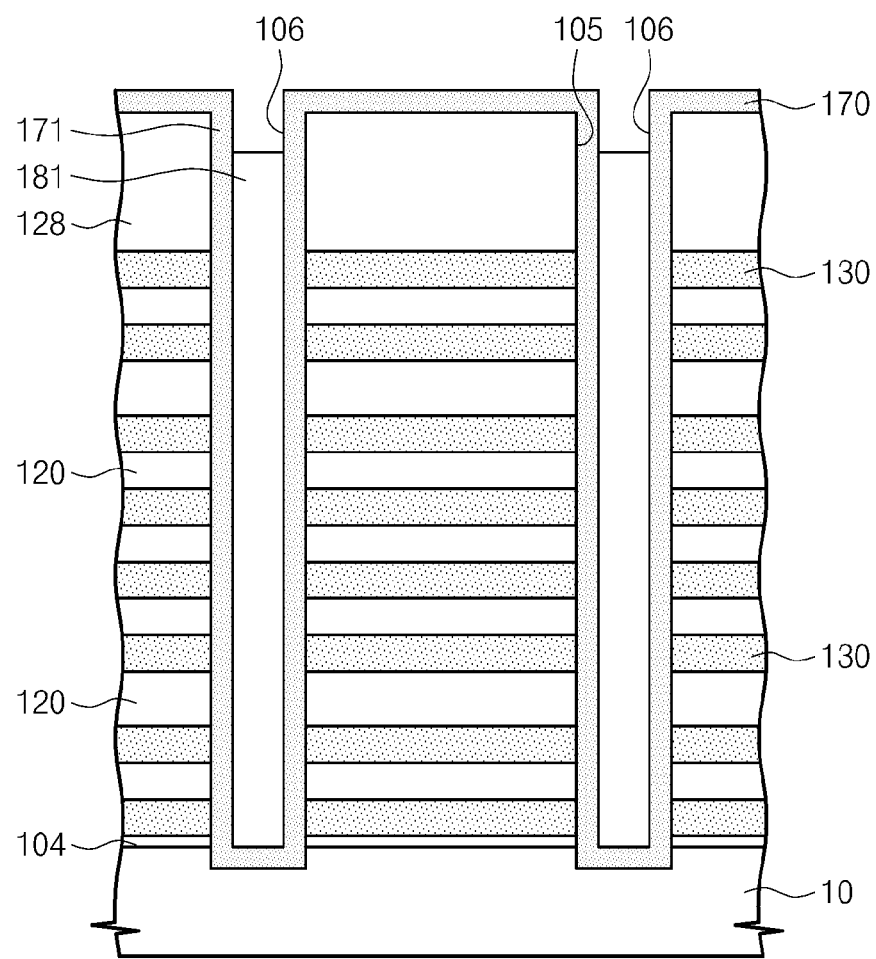

Referring to the example embodiment of FIG. 13, the first gap-filling layer 180 within the semiconductor layer 170 may be partially removed to form first gap-filling patterns 181 defining second channel holes 106. The formation of the first gap-filling pattern 181 may include etching the first gap-filling layer 180 in an etch-back manner. In some embodiments, the etching of the first gap-filling layer 180 may be performed in such a way that the first gap-filling pattern 181 may have a top surface positioned at a lower level than that of the top surface of the uppermost insulating layer 128.

Figure 14:
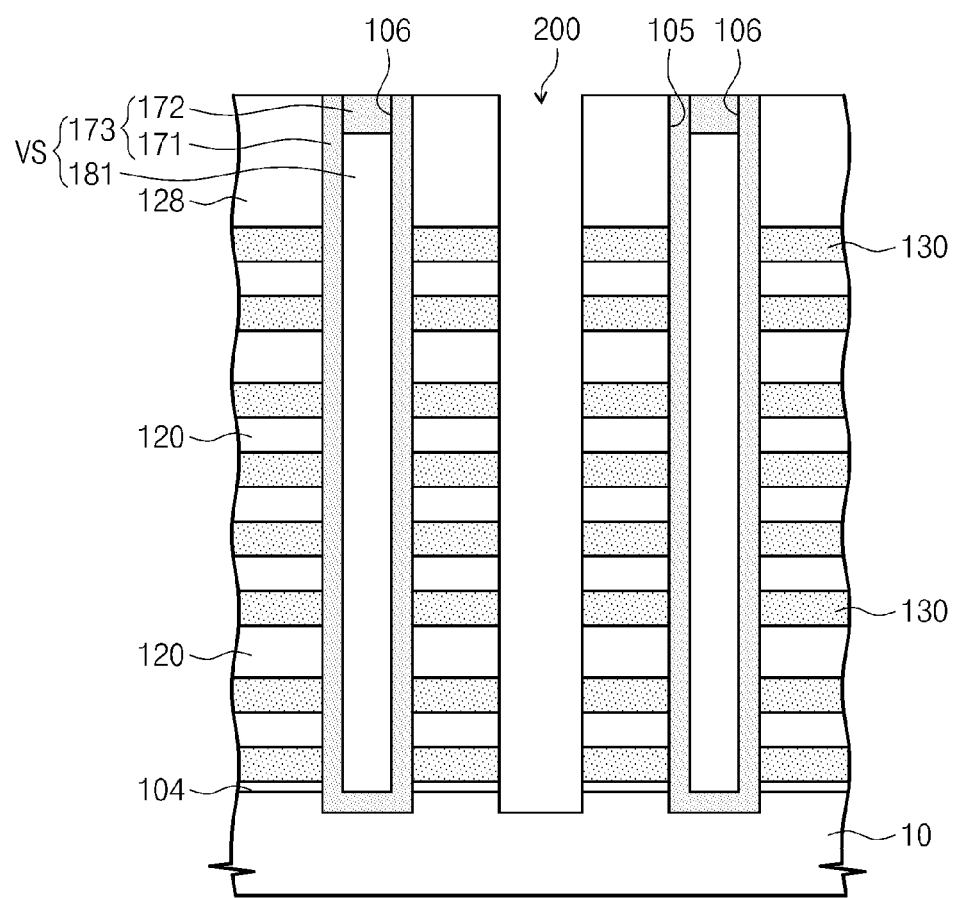

Referring to the example embodiment of FIG. 14, a semiconductor layer (not shown) may be formed to fill the second channel holes 106 and then be planarized to remove the semiconductor layer 170 from the top surface of the uppermost insulating layer 128. As the result of the planarization, a first semiconductor pattern 171 and a second semiconductor pattern 172 may be formed in the second channel holes 106. The second semiconductor pattern 172 may be disposed on the first gap-filling pattern 181 to fill the second channel holes 106. The first and second semiconductor patterns 171 and 172 may constitute active patterns 173, and the active patterns 173 and the first gap-filling pattern 181 may constitute first structures VS. In some embodiments, the active patterns 173 may be p-type or intrinsic.

The mold structure 1000 may be further patterned to form trenches 200 exposing the substrate 10. In some embodiments, the trenches 200 may be formed spaced apart from the first structures VS (e.g., between the first structures VS), as shown. The formation of the trenches 200 may include forming an etch-mask on the mold structure 1000, and anisotropically etching layers below the etch-mask to, for example, expose the top surface of the substrate 10. In some embodiments, as shown in FIG. 14, a top surface of the substrate 10 defining a bottom surface of the trenches 200 may be recessed by over-etching during anisotropic etching of the layers below the etch mask.

Figure 15:
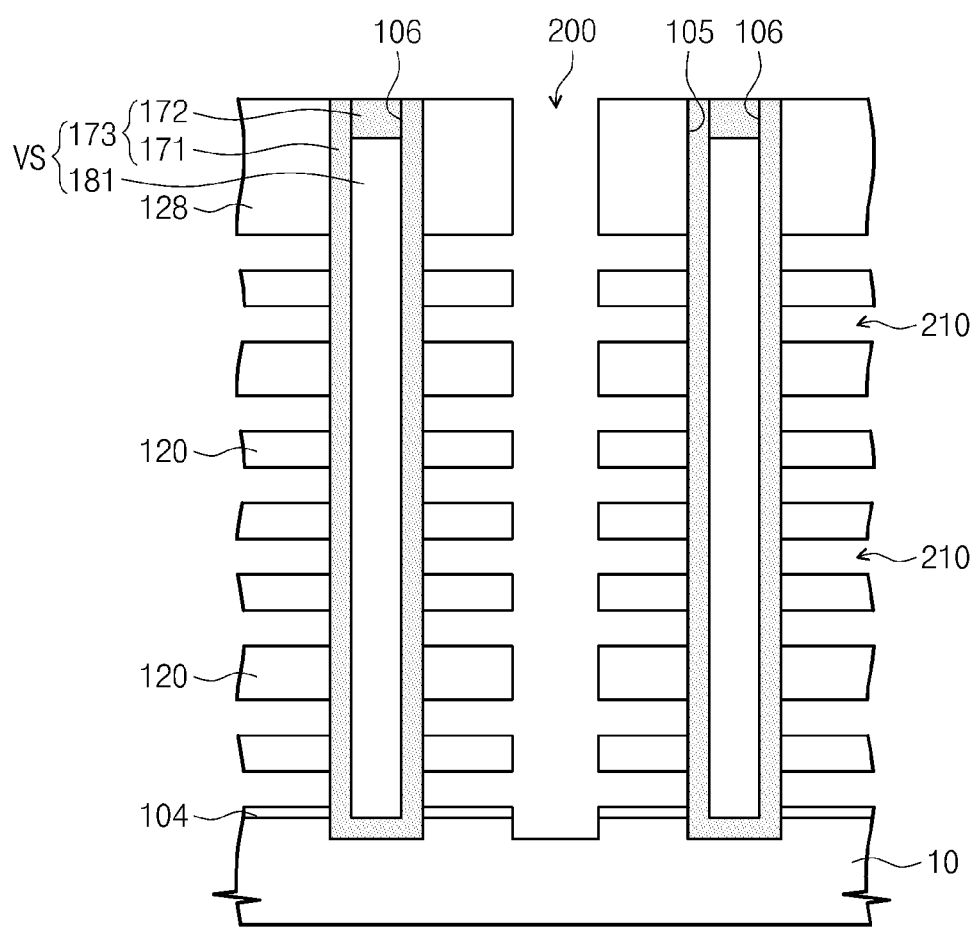

Referring to the example embodiment of FIG. 15, recess regions 210 may be formed between the insulating layers 120 by selectively removing the sacrificial layers 130 exposed by the trenches 200. In more detail, an outer boundary of the recess region 210 may be defined by the insulating layers 120 and the trenches 200, and an internal boundary of the recess region 210 may be defined by the active patterns 173.

The formation of the recess regions 210 may include horizontally etching the sacrificial layers 130 using, for example, an etchant and/or etch process with etch selectivity to the insulating layers 120 and the active patterns 173. For example, in the case that the sacrificial layers 130 are formed of silicon nitride and the insulating layers 120 are formed of silicon oxide, the horizontal etch may be performed using an etchant including phosphoric acid.

Figure 16:
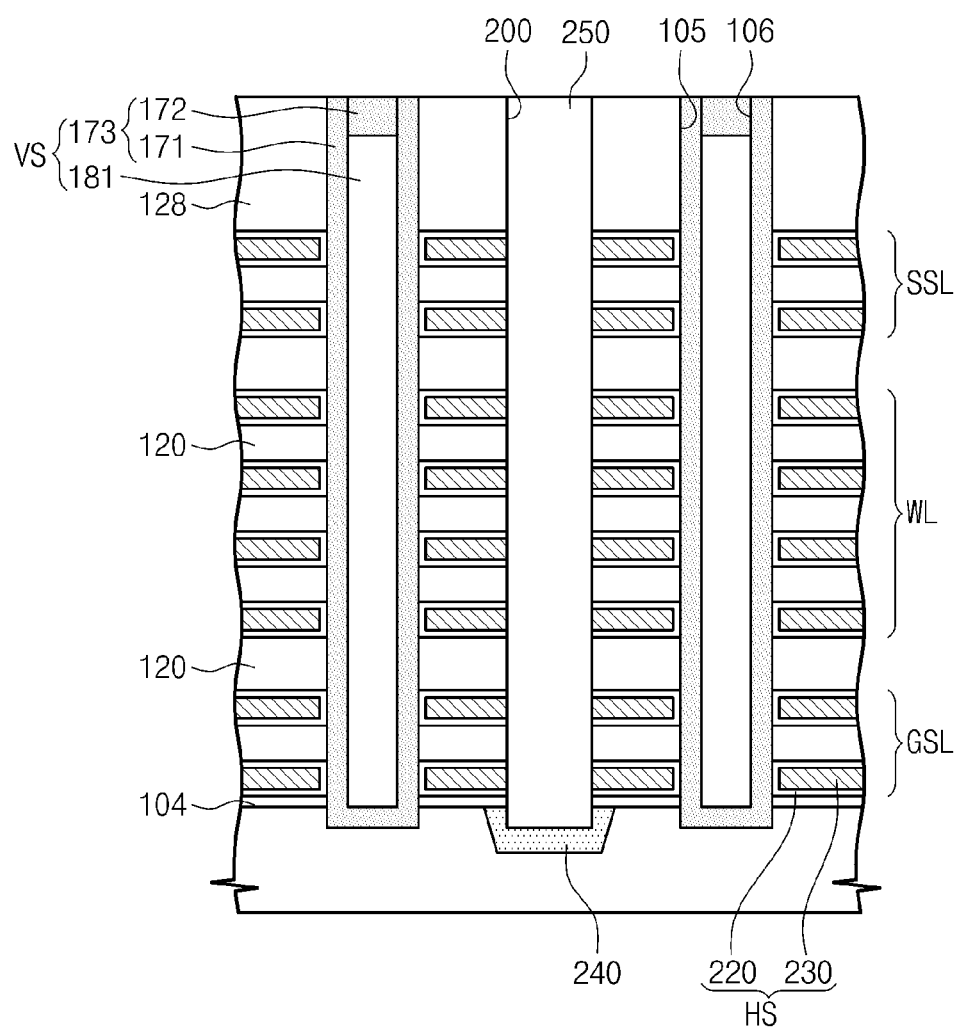

Referring to the example embodiment of FIG. 16, second structures HS may be formed to fill the recess regions 210. The second structures HS may include a memory layer 220 covering the inner walls of the recess region 210 and conductive patterns 230 filling the remaining space of the recess region 210.

The formation of the second structures HS may include sequentially forming the memory layer 220 and a conductive layer to fill the recess regions 210, and removing the conductive layer from the trenches 200 to remain the conductive patterns 230 in the recess regions 210. Technical features related to the memory layer 220 will be described in more detail with reference to FIGS. 26 through 28. The conductive layer may be formed to fill the recess regions 210 covered by the memory layer 220. The trenches 200 may be completely and/or partially filled by the conductive layer. The conductive layer may include, for example, doped silicon, metallic materials, metal nitride layers, and/or metal silicide. For example, the conductive layer may include at least one layer of tantalum nitride and/or tungsten. In some embodiments, the conductive layer may be formed to conformally cover the inner walls of the trench 200, and the forming of the conductive patterns 230 may include removing the conductive layer from the trench 200 using, for example, an isotropic etching process. In other embodiments, the conductive layer may be formed to fill the trench 200, and the forming of the conductive patterns 230 may include anisotropically etching the conductive layer to selectively remove the conductive layer from the trench 200.

Second doped regions 240 may be formed in the substrate 10 exposed by the trenches 200. The second doped regions 240 may have a different conductivity type from the substrate 10 (for instance, n-type). The second doped regions 240 may be formed using an ion implantation process, for example.

Second gap-filling patterns 250 may be formed to fill the trenches 200. The formation of the second gap-filling patterns 250 may include forming an insulating layer on the resultant structure provided with the trenches 200, and then etching the insulating layer to expose the top surface of the uppermost insulating layer 128. The second gap-filling patterns 250 may be formed of, for example, at least one of a silicon oxide layer, a silicon nitride layer, and a silicon oxynitride layer, and the etching of the insulating layer may be performed using a planarization technique, for example, a chemical-mechanical polishing technique and/or an etch-back technique.

Figure 17:
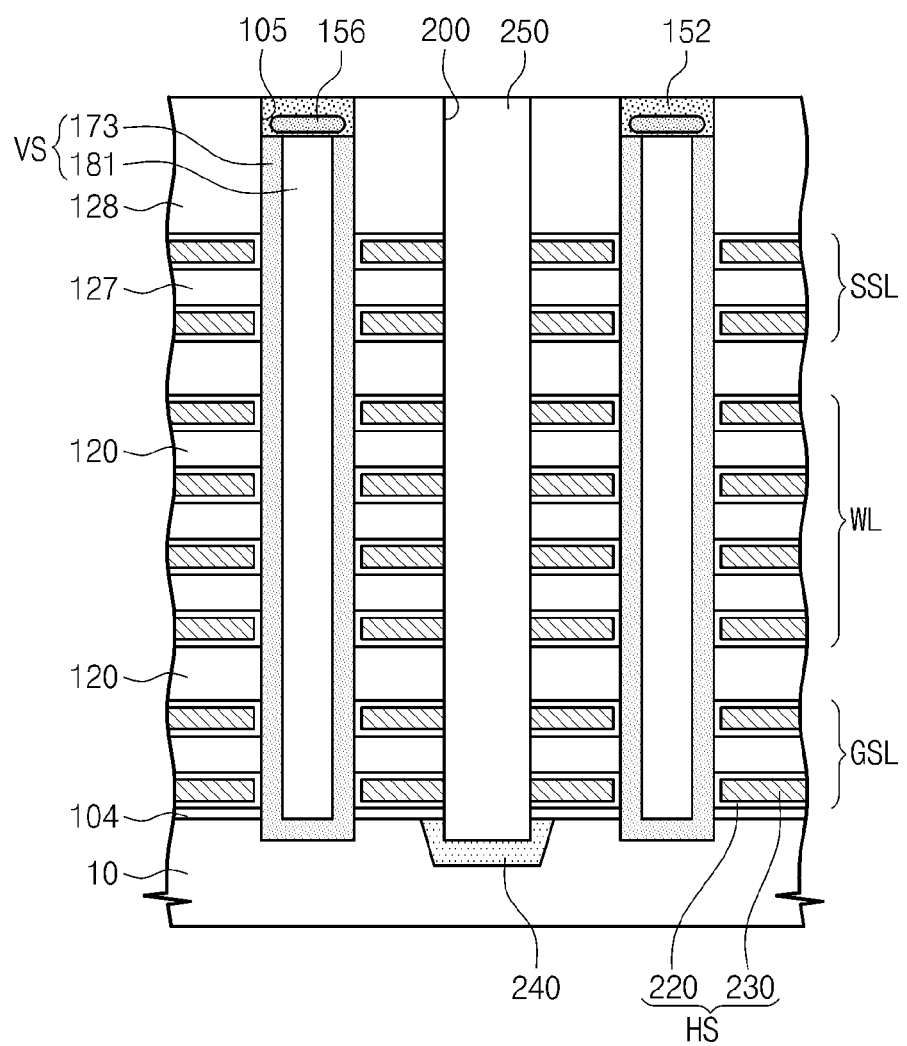

Referring to the example embodiment of FIG. 17, a diffusion-resistant doped region 156 may be formed in an upper portion of the active patterns 173. The diffusion-resistant doped region 156 may be doped with carbon and be formed using one of various doping methods, such as an ion implantation process, an in-situ doping process, or a diffusion process. In some embodiments, the diffusion-resistant doped region 156 may be formed to have the same configuration as those depicted in FIGS. 3 through 5 and to have the same concentration as those depicted in the graphs of FIGS. 7 through 9. Methods of forming the diffusion-resistant doped region 156 will be described in more detail with reference to FIGS. 18 through 23.

An impurity injection region 152 may be formed in the upper portion of the active patterns 173. The impurity injection region 152 may be formed by doping the upper portion of the active patterns 173 with impurities having a conductivity type that is different from that of the substrate 10. In some embodiments, the impurity injection region 152 may be doped with impurities of n-type. The impurity injection region 152 may be formed using an ion implantation process or a diffusion process. Thereafter, an annealing process may be performed on the resultant structure provided with the impurity injection region 152 and the diffusion-resistant doped region 156. The annealing process may cure lattice defects in the active patterns 173, which may occur during the ion implantation processes for forming the impurity injection region 152 and/or the diffusion-resistant doped region 156. As the result of the annealing process, impurities in the impurity injection region 152 may be downward diffused to form the impurity extension region 153 shown in FIG. 3. In addition, the annealing process may also expand the diffusion-resistant doped region 156. Thereafter, upper plugs (not shown) may be respectively formed on the first structures VS and upper interconnection lines (not shown) may be formed on the upper plugs to connect the upper plugs with each other.

Figure 18:
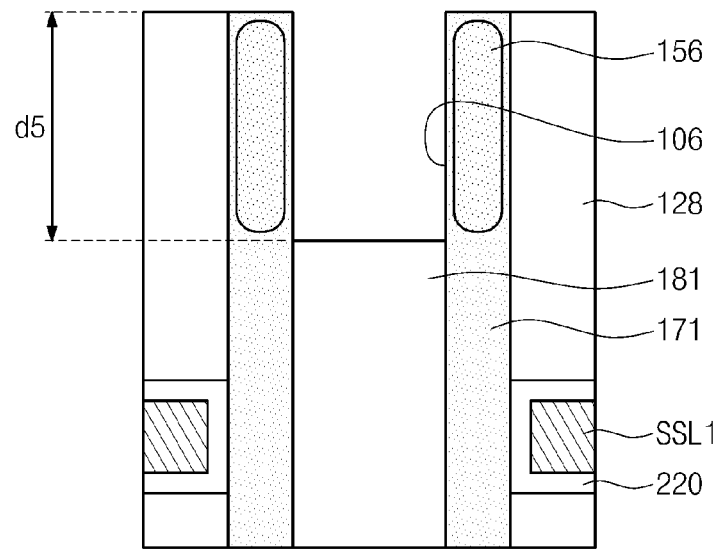
Figure 19:
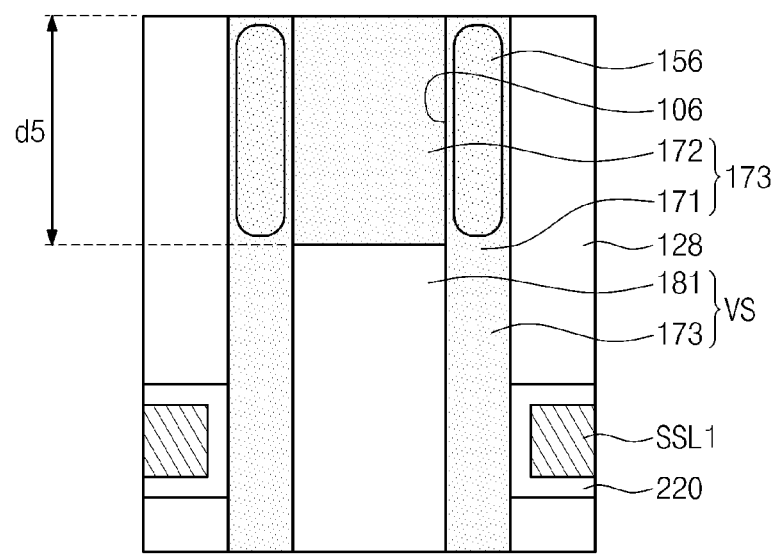
Figure 20:
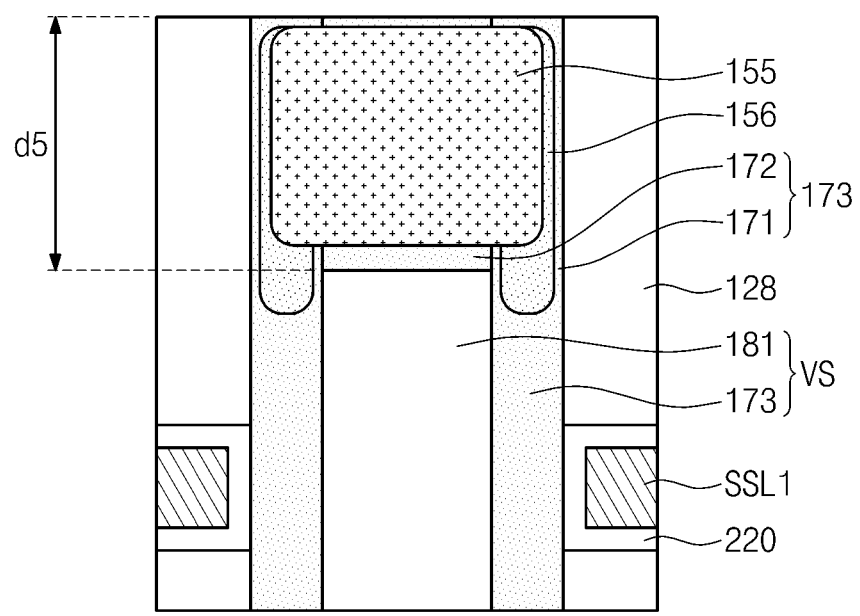

FIGS. 18 through 20 are sectional views illustrating an example embodiment of alternative methods of forming the diffusion-resistant doped region 156, according to aspects of the inventive concept. Referring to the example embodiment of FIG. 18, a doping process may be performed on the resultant structure of FIG. 13 to form the diffusion-resistant doped region 156 in the first semiconductor pattern 171. For instance, the diffusion-resistant doped region 156 may be formed using anion implantation process or a diffusion process. In some embodiments, the diffusion-resistant doped region 156 may have a bottom surface located at the substantially same level as a bottom surface of the second channel holes 106. That is, a vertical length of the diffusion-resistant doped region 156 may be the same as a depth d5 of the second channel holes 106. In the meantime, during the doping process, carbon may be injected into the first gap-filling pattern 181 or the uppermost insulating layer 128. Referring to FIG. 19, a second semiconductor pattern 172 may be formed to fill the second channel holes 106.

Referring to FIG. 20, a first doped region 155 may be formed in the upper portion of the active patterns 173. For instance, the first doped region 155 may be doped with n-type impurities. A portion of the first doped region 155 may overlap the diffusion-resistant doped region 156. As the result of this overlap, the n-type impurities in the first doped region 155 may be prevented from being excessively diffused into the channel connecting region adjacent to the first doped region 155. Due to the annealing process or a thermal process to be described below, the diffusion-resistant doped region 156 may be expanded to have a bottom surface located below a top surface of the first gap-filling pattern 181. According to the present embodiment, the diffusion-resistant doped region 156 may be formed to have a doping profile similar to that depicted in FIG. 9.

Figure 21:
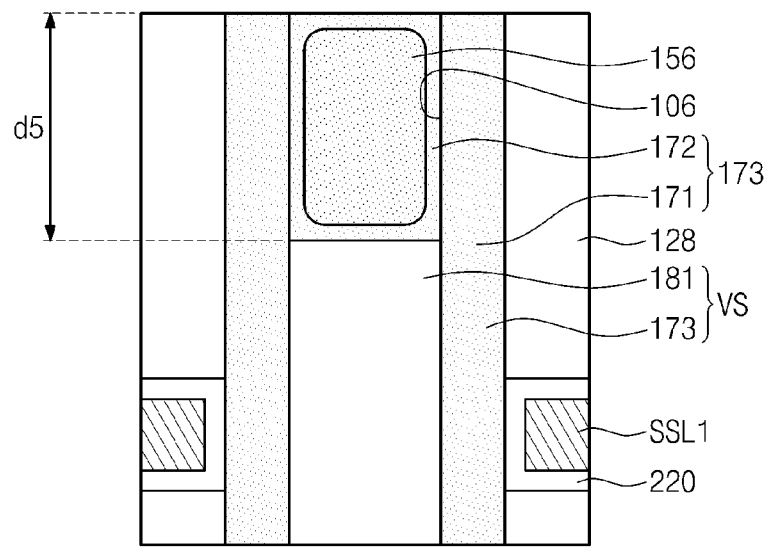
Figure 22:
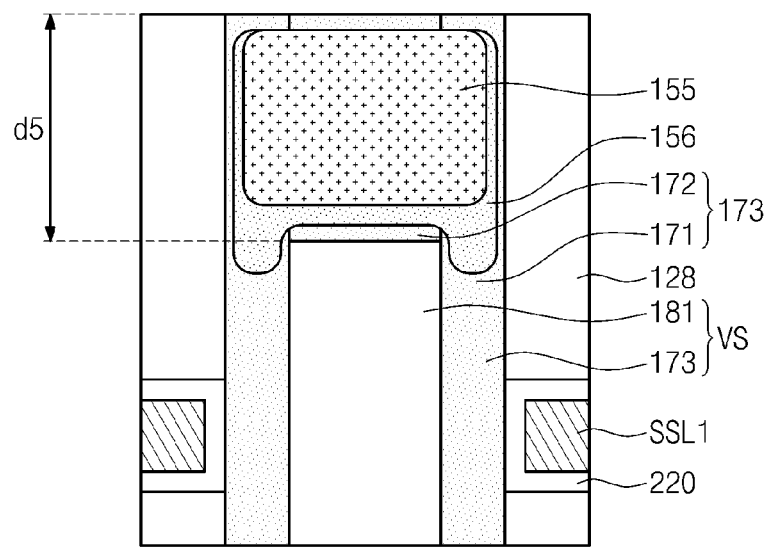

FIGS. 21 and 22 are sectional views illustrating example embodiments of alternative methods of forming the diffusion-resistant doped region 156, according to other aspects of the inventive concept. Referring to the example embodiment of FIG. 21, the second semiconductor pattern 172 may be formed in the second channel holes 106. In some embodiments, the diffusion-resistant doped region 156 may be formed in an in-situ manner, during the formation of the second semiconductor pattern 172.

Referring to the example embodiment of FIG. 22, the first doped region 155 may be formed in the upper portion of the active patterns 173. In some embodiments, an annealing process or a thermal process described below may be performed, such that the diffusion-resistant doped region 156 may be downward expanded, as depicted in FIG. 22.

However, according to aspects of the inventive concept, the downward expansion of the first doped region 155 can be suppressed or prevented by the presence of carbon atoms injected in the diffusion-resistant doped region 156. This enables a reduction in a change in impurity doping profile and an increase in electrical resistance of the channel connecting region.

Figure 23:
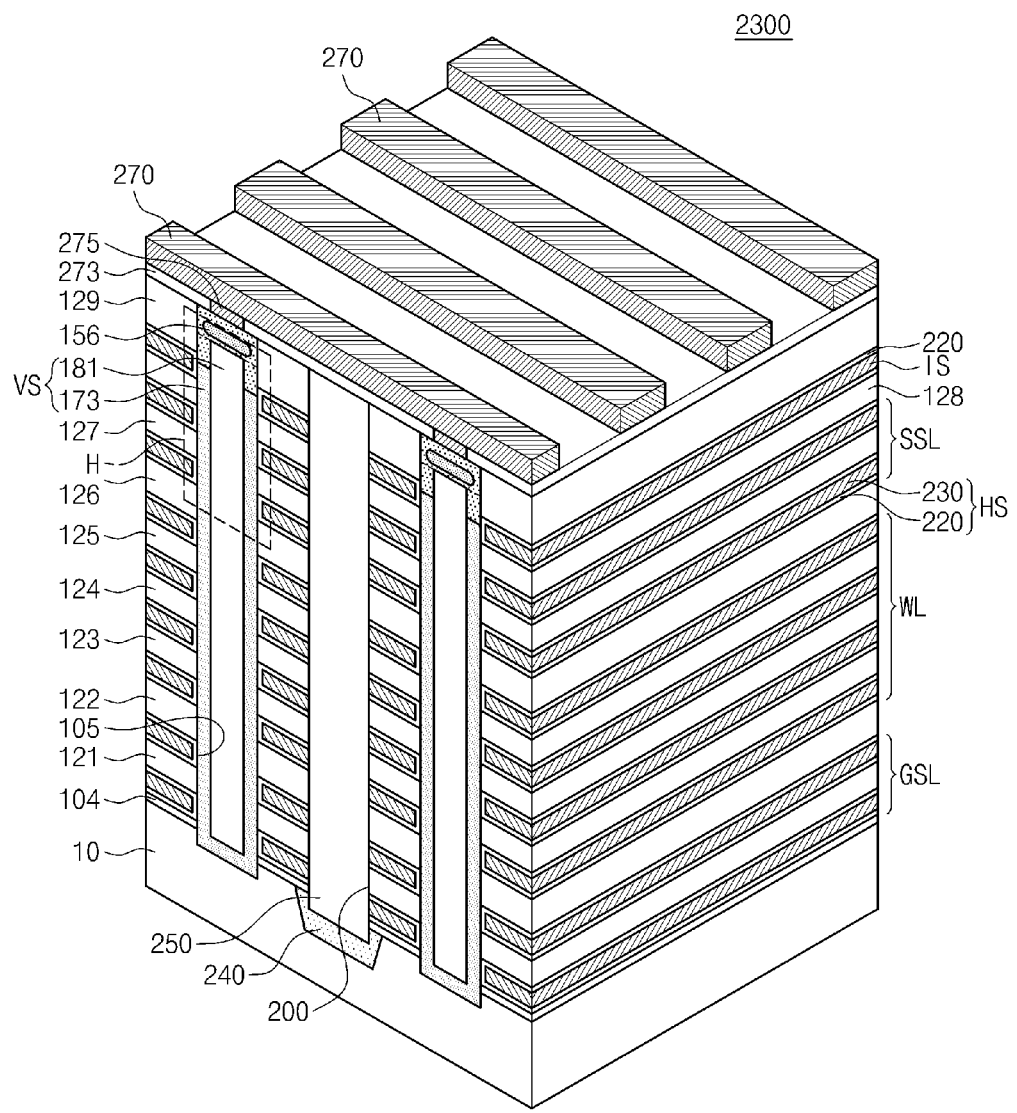
Figure 24:
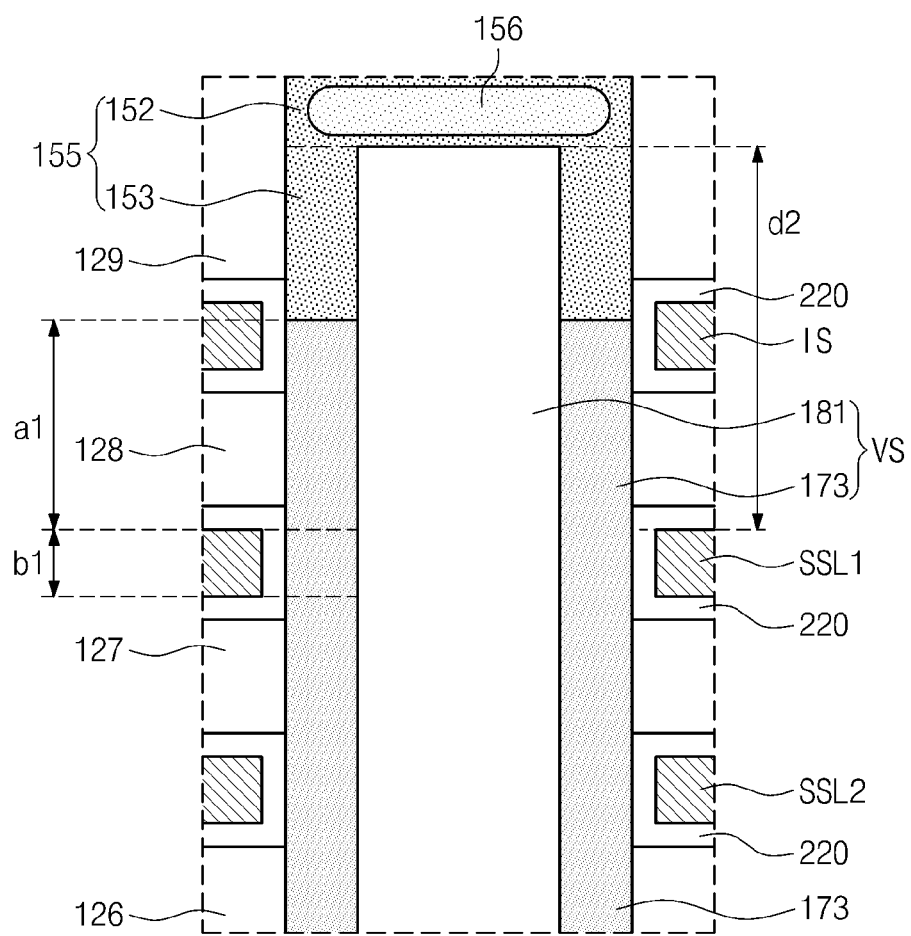
Figure 25:
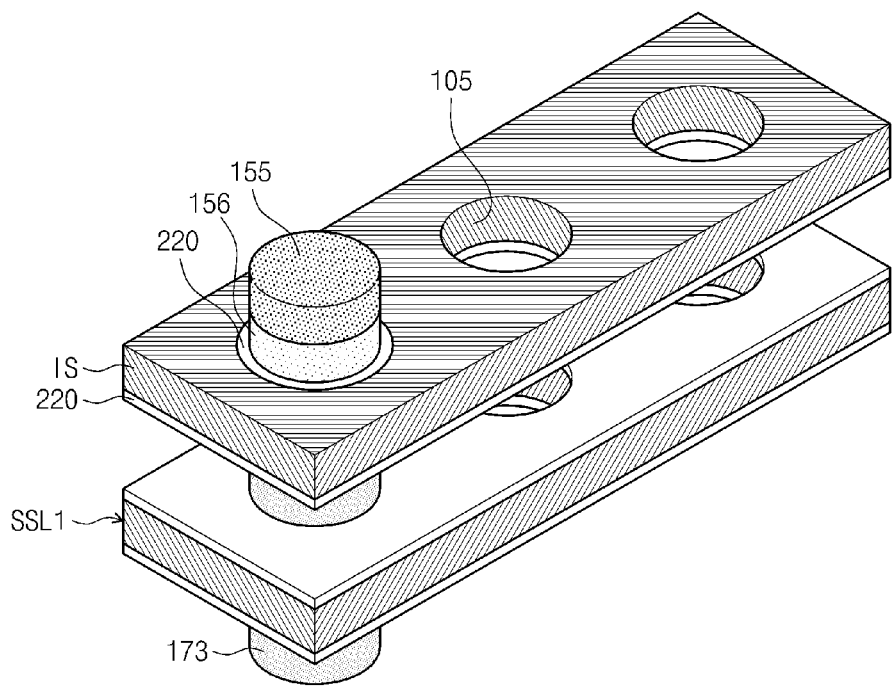

FIG. 23 is a perspective view of another example embodiment of a three-dimensional semiconductor device 2300, according to aspects of the inventive concept, FIG. 24 is an enlarged sectional view of a portion H of FIG. 23, and FIG. 25 is an enlarged perspective view exemplarily illustrating some of elements depicted in FIG. 23. For convenience in description, the aforesaid technical features may not be repeated below.

Referring to the example embodiments of FIGS. 23 through 25, a diffusion-resistant doped region 156 may be formed in an upper portion of the active patterns 173. Due to the presence of the diffusion-resistant doped region 156, it is possible to prevent or suppress the first doped region 155 from being vertically expanded. In some embodiments, the diffusion-resistant doped region 156 may be formed using the same method as one of the methods described with reference to FIGS. 10 through 17, and therefore, it may be configured to have the same structural features as one of the semiconductor devices described with reference to FIGS. 2 through 5.

An inversion inducing pattern IS may be provided on the substrate 10. The inversion inducing pattern IS may be disposed between the first string selection line SSL1 and the impurity injection region 152. In some embodiments, the impurity extension region 153 may be formed by a downward diffusion of impurities in the impurity injection region 152. However, in the case that there is a difference in diffusion length and the first string selection line SSL1 is formed adjacent to the impurity extension region 153, the string selection transistors may exhibit position-dependent operational characteristics (e.g., a leakage current property). To reduce this position-dependence, a vertical length of d2 region may be greater than a distance between the string selection lines and/or a distance between the word lines.

The increase in vertical length of the d2 region may make it difficult to induce the inversion region in the first channel connecting region a1 or to uniformly form the inversion region. This leads to an increase in electric resistance of the first channel connecting region a1.

According to aspects of the present embodiments, this can be reduced, because the inversion inducing pattern IS is provided between the first string selection line SSL1 and the impurity injection region 152. In some embodiments, substantially constant voltage may be applied to the inversion inducing pattern IS in any of programming, reading, and erasing operations of the semiconductor device. For example, a voltage less than the turn on voltage of the memory cell transistors may be applied to the inversion inducing pattern IS. In other embodiments, the inversion inducing pattern IS may be in an electrically floating state.

In more detail, due to the presence of the inversion inducing pattern IS, an inversion region may be easily and/or uniformly induced in the first channel connecting region a1, during the operation of the semiconductor device.

In some embodiments, in view of vertical position, a portion of the inversion inducing pattern IS may be overlapped with the first doped region 155. Unlike the case that the first string selection line SSL1 is vertically overlapped with the first doped region 155, the vertical overlap between the inversion inducing pattern IS and the first doped region 155 may not cause an operational problem related to the string selection transistor. Accordingly, there is no necessity for additionally increasing the vertical length of the d2 region, even when the inversion inducing pattern IS is disposed between the first string selection line SSL1 and the first doped region 155. In other embodiments, unlike shown in the example embodiments of FIGS. 23 and 24, the inversion inducing pattern IS may not be overlapped with the first doped region 155, in terms of vertical position.

The inversion inducing pattern IS may be formed to substantially or completely surround the first structures VS. For instance, as shown in FIG. 25, the inversion inducing pattern IS may have a substantially planar shape extending parallel to the conductive patterns 230 and a plurality of the active patterns 173 may be formed to penetrate the inversion inducing pattern IS. In addition, an insulating layer may be provided between the inversion inducing pattern IS and the active patterns 173. In some embodiments, the memory layer 220 described above may be used as the insulating layer, but example embodiments of the inventive concept may not be limited thereto. For instance, the insulating layer may be variously modified in terms of shape or material, as examples.

The inversion inducing pattern IS may include a conductive material. For instance, the inversion inducing pattern IS may include at least one of a metal layer, a conductive metal nitride layer, or a doped silicon layer. In some embodiments, the inversion inducing pattern IS may be formed of the same material as the conductive patterns 230. In some embodiments, the inversion inducing pattern IS may be formed using the process for forming the conductive patterns 230. In this case, there may be no necessity to perform an additional process for the inversion inducing pattern IS.

Figure 26:
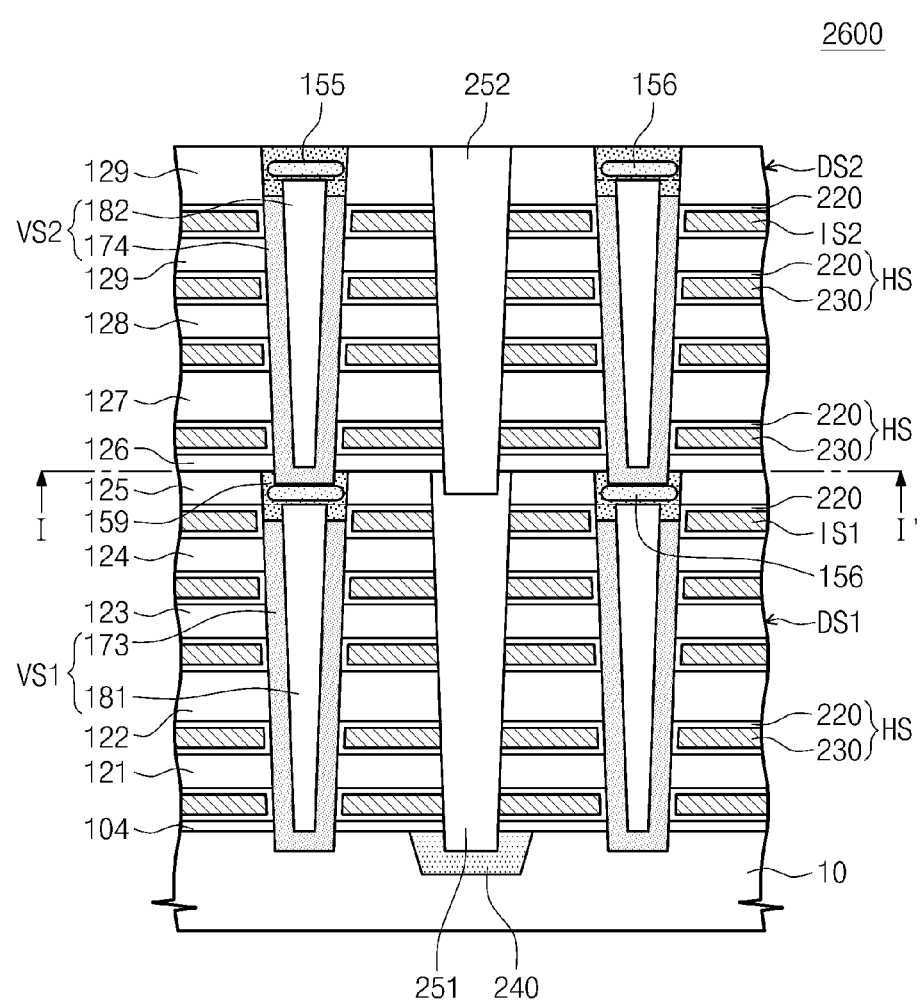

FIG. 26 is a sectional view presented to describe another example embodiment of a three-dimensional semiconductor device 2600 and a fabricating method thereof, according to still other aspects of the inventive concept. Referring to the example embodiment of FIG. 26, a three-dimensional semiconductor device 2600 may include a first stacking structure DS1 and a second stacking structure DS2, which are sequentially stacked on the substrate 10. A line I-I' in FIG. 26 represents an interface between the first and second stacking structures DS1 and DS2. The interface may represent a top surface or region of the first stacking structure DS1 and a bottom surface or region of the second stacking structure DS2.

Each of the first and second stacking structures DS1 and DS2 may include the second structure HS. The second structure HS may include the conductive patterns 230 and the memory layer 220, as described above.

The three-dimensional semiconductor device may further include first structures VS1 and VS2 penetrating the first and second stacking structures DS1 and DS2, respectively, also as described above. The first structures VS1 and VS2 may include first active patterns 173 and second active patterns 174, respectively. In addition, the first structures VS1 and VS2 may include first gap-filling patterns 181 and 182, respectively. The three-dimensional semiconductor device may further include second gap-filling patterns 251 and 252 crossing the first and second stacking structures DS1 and DS2, respectively.

A first doped region 155 may be provided in an upper portion of the second active pattern 174. The diffusion-resistant doped region 156 may be provided in the first doped region 155. The diffusion-resistant doped region 156 may be provided in a connection pad, which will be described below. A second inversion inducing pattern IS2 may be formed adjacent to the first doped region 155. The second inversion inducing pattern IS2 may be configured to induce an inversion region in the channel connecting region, and as a result, an electric resistance of the channel connecting region can be reduced.

The second active pattern 174 may be electrically connected to the first active patterns 173 via a connection pad 159. The connection pad 159 may be a doped region having a different conductivity type from the substrate 10. For instance, the connection pad 159 may be n-type. Similar to the second active pattern 174, n-type impurities in the connection pad 159 may be downward diffused. A first inversion inducing pattern IS1 may be provided adjacent to the connection pad 159. The first inversion inducing pattern IS1 may be provided between a pair of vertically separated conductive patterns disposed adjacent to the connection pad 159. If a specific voltage is applied to the conductive patterns 230 disposed adjacently below the first inversion inducing pattern IS1, the first inversion inducing pattern IS1 can be capacitively coupled with the conductive patterns 230 to induce an inversion region in the first active patterns 173. This enables reduction of a leakage current in the first active patterns 173 and an electric resistance of the first active patterns 173.

Figure 27:
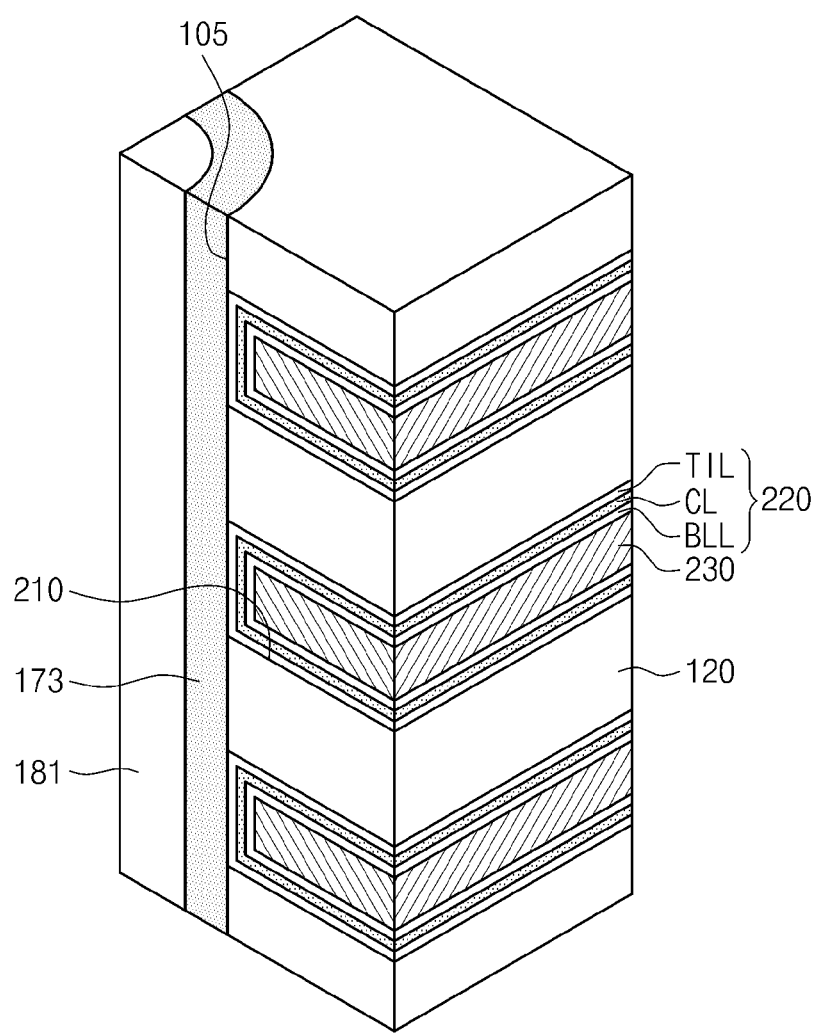
Figure 28:
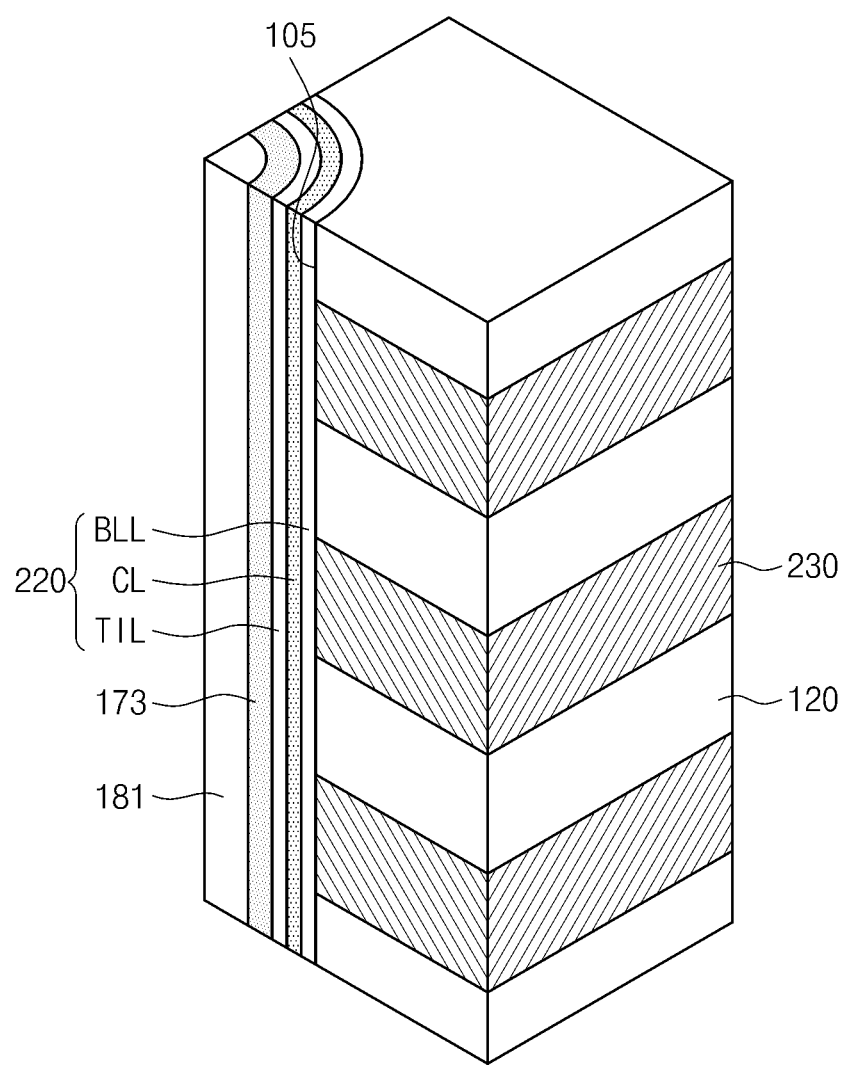
Figure 29:
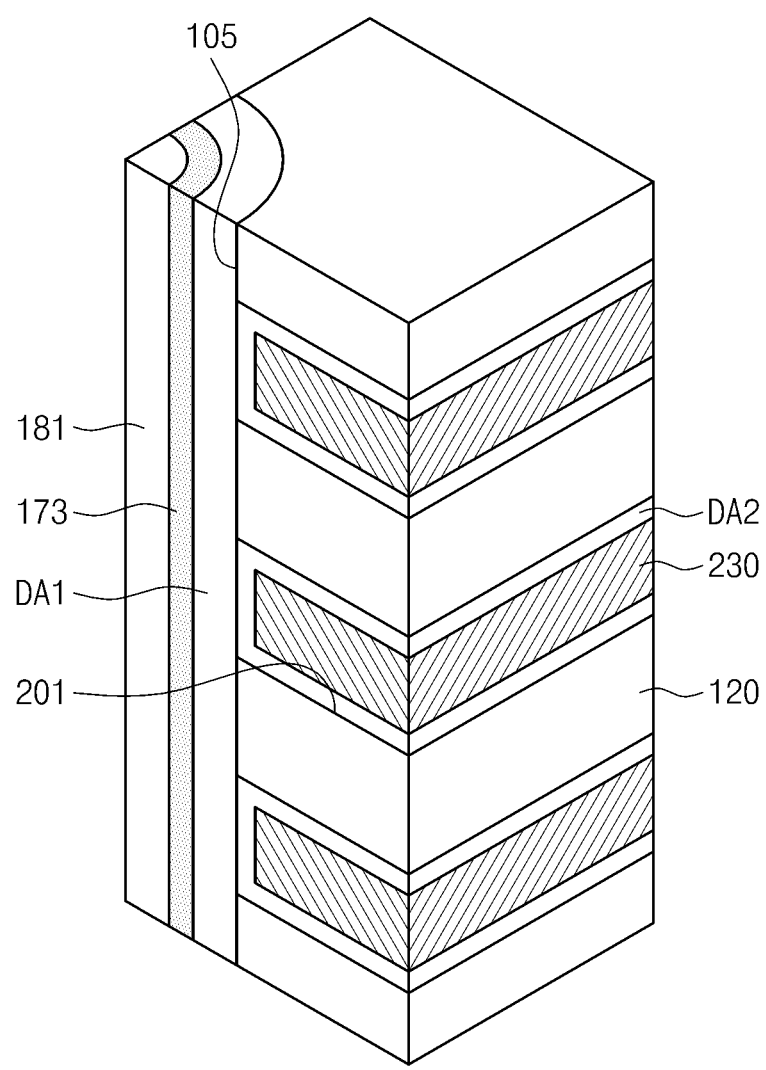

FIGS. 27 through 29 are enlarged perspective views illustrating example embodiments of memory layers, according to some aspects of the inventive concept.

Referring to the example embodiment of FIG. 27, at least one of the first and second structures may include the memory layer 220 disposed on a sidewall of the channel holes 105. The memory layer 220 may include a tunnel insulating layer TIL, a charge storing layer CL, and a blocking insulating layer BLL, which are sequentially stacked on the recess region 210. Layers constituting the memory layer 220 may be formed using a deposition technique providing, for example, excellent and/or improved step-coverage property (e.g., a CVD and/or ALD technique).

The charge storing layer CL may be one or more insulating layers with abundant trap sites and/or one or more insulating layers with nano particles and may be formed, for example, by CVD and/or ALD. For example, the charge storing layer CL may include one of a trap insulating layer and/or an insulating layer with a floating gate electrode and/or conductive nano dots. In some embodiments, the charge storing layer CL may include a silicon nitride layer, a silicon oxynitride layer, a silicon-rich nitride layer, a nano crystalline silicon layer, and/or a laminated trap layer.

The tunnel insulating layer TIL may be formed from one or more materials having a higher band gap than the charge storing layer CL, and may be formed by, for example, CVD and/or ALD. For example, the tunnel insulating layer TIL may be a silicon oxide layer. The tunnel insulating layer TIL may undergo a thermal treatment performed after a deposition process. The thermal treatment process may be, for example, a rapid thermal nitridation (RTN) process and/or an annealing process in an atmosphere including nitrogen and/or oxygen.

In some embodiments, the blocking insulating layer BLL may be a single-layered insulating layer. In other embodiments, the blocking insulating layer BLL may be formed to have a multi-layered structure, for instance, including first and second blocking insulating layers (not shown). The first and second blocking insulating layers may be formed of different materials, and one of them may be formed from one or more materials having a smaller band bap than the tunnel insulating layer TIL and a larger band gap than the charge storing layer CL. The first and second blocking insulating layers may be formed by, for example, CVD and/or ALD, and at least one of them may be formed by wet oxidation. In some embodiments, the first blocking insulating layer may be one of high-k dielectric layers (e.g., an aluminum oxide layer and/or a hafnium oxide layer), and the second blocking insulating layer may be, for example, a material with a smaller dielectric constant than the first blocking insulating layer. In other embodiments, the second blocking insulating layer may be a high-k dielectric layer and the first blocking insulating layer may be of a material with a smaller dielectric constant than the second blocking insulating layer.

Referring to the example embodiment of FIG. 28, the memory layer 220 may be formed in the channel holes 105 before the formation of the active patterns 173. For instance, the formation of the memory layer 220 may include sequentially forming the blocking insulating layer BLL, the charge storing layer CL, and the tunnel insulating layer TIL on a sidewall of the channel holes 105. The active patterns 173 and the first gap-filling pattern 181 may be formed to fill the channel holes 105 provided with the memory layer 220.

Referring to the example embodiment of FIG. 29, the memory layer may include a first memory layer DA1 and a second memory layer DA2. The first memory layer DA1 may be formed in the channel holes 105, and the second memory layer DA2 may be formed in the recess region 210. According to the present embodiments, some of the blocking insulating layer BLL, the charge storing layer CL, and the tunnel insulating layer TIL may constitute the first memory layer DA1, and the others of them may constitute the second memory layer DA2.

Figure 30:
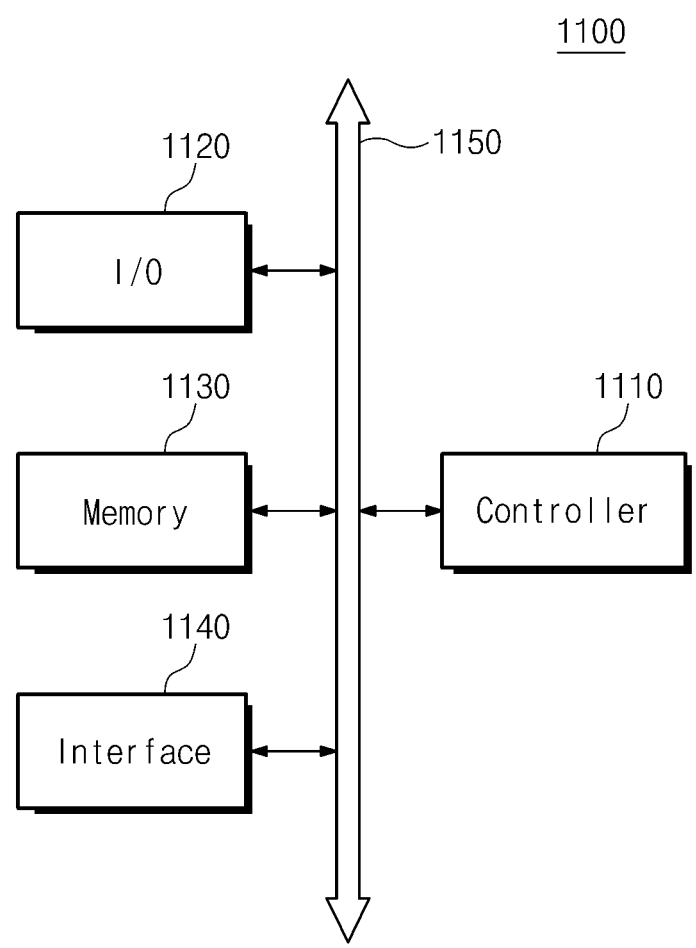

FIG. 30 is a schematic block diagram illustrating an example embodiment of a memory system including a 3D semiconductor memory device, according to aspects of the inventive concept.

Referring to FIG. 30, a memory system 1100 can be applied to a personal digital assistant (PDA), a portable computer, a web tablet, a wireless phone, a mobile phone, a digital music player, a digital camera or other recording device, a printer, a memory card and/or all the devices that can transmit and/or receive data in a wireless communication environment.

In this embodiment, the memory system 1100 includes a controller 1110, an input/output device 1120 such as a keypad and a display device, a memory 1130, an interface 1140, and a bus 1150. The memory 1130 and the interface 1140 communicate with each other through the bus 1150.

The controller 1110 includes at least one microprocessor, at least one digital signal processor, at least one micro controller or other process devices similar to the microprocessor, the digital signal processor and the micro controller. The memory 1130 may be used to store an instruction executed by the controller 1110. The input/output device 1120 can receive data and/or signals from the outside of the system 1100 and/or transmit data and/or signals to the outside of the system 1100. For example, the input/output device 1120 may include a keyboard, a keypad and/or a displayer.

The memory 1130 includes a nonvolatile memory device according to aspects of the inventive subject matter. The memory 1130 may further include a different kind of memory, e.g., a volatile memory device capable of random access and various other kinds of memories.

The interface 1140 is configured to transmit data to a communication network and/or receive data from a communication network.

Figure 31:
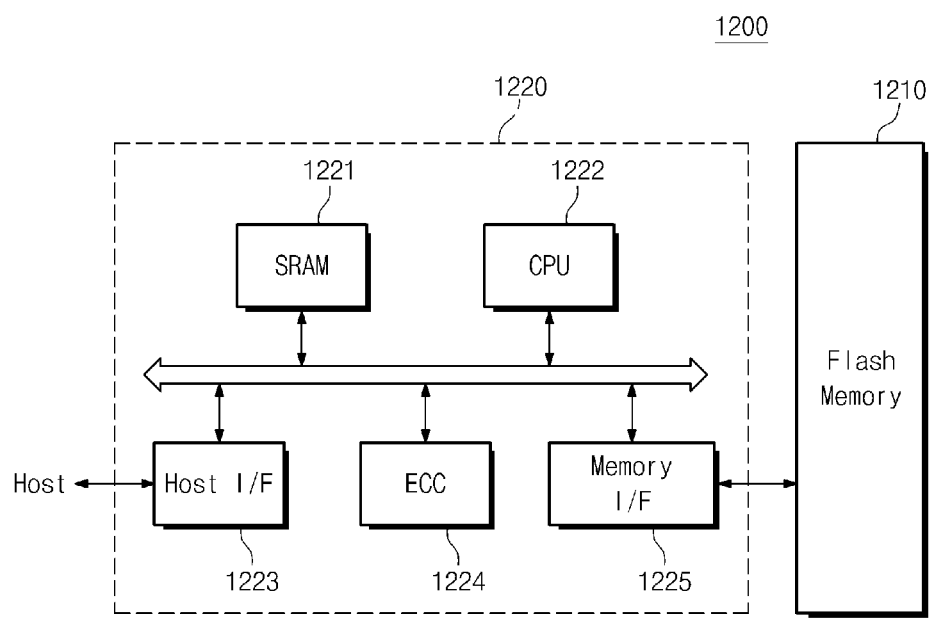

FIG. 31 is a block diagram illustrating an example embodiment of a memory card including a three-dimensional semiconductor memory device according to some embodiments of the inventive concept.

Referring to FIG. 31, the memory card 1200 for supporting memory device having a large storage capacity, including a memory device 1210 according to aspects of the inventive concept. The memory card 1200 according to some embodiments of the inventive concept includes a memory controller 1220 configured to control every data exchange between a host and the memory device 1210.

A static random access memory (SRAM) 1221 is used as an operational memory of a processing unit 1222. A host interface 1223 includes data exchange protocols of a host to be connected to the memory card 1200. An error correction block 1224 detects and corrects errors included in data readout from a multi-bit memory device 1210. A memory interface 1225 interfaces with the memory device 1210, according to aspects of the inventive concept. The processing unit 1222 performs control operations for exchanging data of the memory controller 1220. Even though not depicted in the drawings, it will be apparent to one of ordinary skill in the art that the memory card 1200 according to aspects of the inventive concept can further include a ROM (not shown) storing code data for interfacing with the host.

Figure 32:
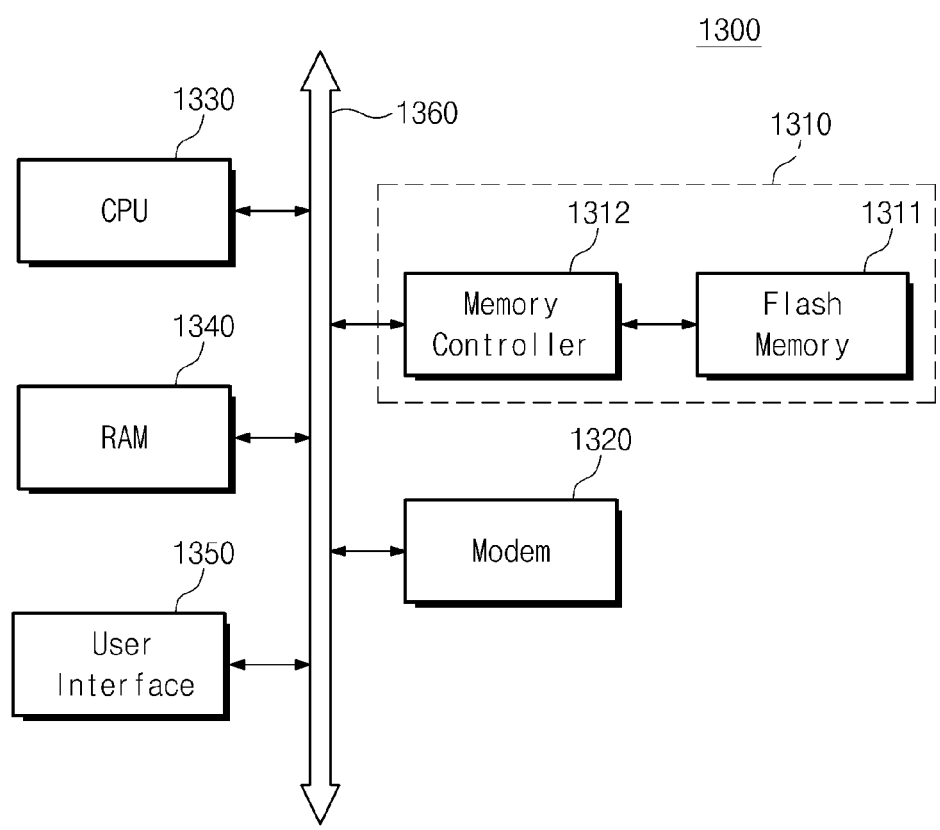

FIG. 32 is a block diagram illustrating an example embodiment of a data processing system 1300 including a semiconductor memory device according to aspects of the inventive concept.

Referring to FIG. 32, the data processing system 1300 according to the inventive concept includes the memory system 1310 and a modem 1320, a central processing unit 1330, a RAM, a user interface 1350 that are electrically connected to a system bus 1360. The memory system 1310 is formed according to the inventive concept, and is built in a data processing system, such as a mobile product or a desktop computer. The memory system 1310 may be constructed to be identical to the memory system or the memory system described above, in various embodiments. The memory system 1310 stores data processed by the central processing unit 1330 or data inputted from an external device. The memory system 1310 may include a solid state disk (SSD) and in this case, the data processing system 1310 can stably store large amounts of data in the memory system 1310. As reliability is improved, the memory system 1310 can reduce resources used to correct errors, thereby providing a high speed data exchange functions to the data processing system 1300. Even though not depicted in the drawings, it will be apparent to one of ordinary skill in the art that the data processing unit 1300 according to some embodiments of the inventive subject matter can further include an application chipset, a camera image processor (CIS), and/or an input/output device, as examples.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique. The package in which the semiconductor memory device according to one of the above embodiments is mounted may further include at least one semiconductor device (e.g., a controller and/or a logic device) that controls the semiconductor memory device.

According to aspects of the inventive concept, the diffusion-resistant doped region may be provided in a drain region of transistor. The diffusion-resistant doped region enables suppression of impurities injected into the drain region from being diffused.

In addition, the inversion inducing pattern may be provided around the active pattern. Due to the presence of the inversion inducing pattern, the inversion region can be easily induced in the channel connecting region.

While example embodiments in accordance with aspects of the inventive concept have been particularly shown and described, it will be understood by one of ordinary skill in the art that variations in form and detail may be made therein without departing from the spirit and scope of the inventive concept, as defined by the attached claims.

What is claimed is:

1. A method of fabricating a three-dimensional semiconductor device, comprising:
    forming a stacking structure including conductive patterns and insulating patterns alternatingly stacked on a substrate; and
    forming an active pattern connected to the substrate through the stacking structure,
    wherein the forming of the active pattern comprises:
        doping an upper portion of the active pattern with carbon; and
        forming a first doped region in the upper portion of the active pattern, the first doped region having a different conductivity type from the substrate wherein the forming of the first doped region comprises injecting n-type impurities into the upper portion of the active pattern such that a point with the highest carbon concentration is located at a lower level than a point with the highest n-type impurity concentration of the first doped region.

2. The method of claim 1, wherein the forming of the stacking structure comprises:
    alternatingly forming the insulating patterns and sacrificial patterns on the substrate; and
    replacing the sacrificial patterns with the conductive patterns.

3. The method of claim 2, wherein the forming of the active pattern comprises:
    forming a first channel hole penetrating the sacrificial patterns and the insulating patterns; and
    forming a first semiconductor pattern and a gap-filling pattern in the first channel hole,
    wherein the carbon doping of the active pattern is performed to inject carbon atoms into the first semiconductor pattern.

4. The method of claim 2, wherein the forming of the active pattern comprises:
    forming a first channel hole to penetrate the sacrificial patterns and the insulating patterns;
    forming a first semiconductor pattern and a gap-filling pattern in the first channel hole;
    removing an upper portion of the gap-filling pattern to form a second channel hole; and
    forming a second semiconductor pattern in the second channel hole;
    wherein the carbon doping of the active pattern is performed in an in-situ manner, during the forming of the second semiconductor pattern.

* * * * *